(12) United States Patent
Saito et al.

(10) Patent No.: US 10,475,882 B2
(45) Date of Patent: Nov. 12, 2019

(54) SEMICONDUCTOR DEVICE

(71) Applicant: Renesas Electronics Corporation, Tokyo (JP)

(72) Inventors: Shigeaki Saito, Ibaraki (JP); Yoshito Nakazawa, Ibaraki (JP); Hitoshi Matsuura, Ibaraki (JP); Yukio Takahashi, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/971,139

(22) Filed: May 4, 2018

(65) Prior Publication Data
US 2018/0350910 A1 Dec. 6, 2018

(30) Foreign Application Priority Data

May 31, 2017 (JP) .................................. 2017-107956

(51) Int. Cl.
| | |
|---|---|
| H01L 29/06 | (2006.01) |
| H01L 29/739 | (2006.01) |
| H01L 29/40 | (2006.01) |
| H01L 29/423 | (2006.01) |
| H01L 29/45 | (2006.01) |
| H01L 29/04 | (2006.01) |

(52) U.S. Cl.
CPC ........ *H01L 29/0696* (2013.01); *H01L 29/045* (2013.01); *H01L 29/0619* (2013.01); *H01L 29/402* (2013.01); *H01L 29/4238* (2013.01); *H01L 29/456* (2013.01); *H01L 29/7397* (2013.01); *H01L 29/407* (2013.01)

(58) Field of Classification Search
CPC ............. H01L 29/4236; H01L 29/0619; H01L 29/0696; H01L 29/402; H01L 29/7397; H01L 29/7811; H01L 29/7396; H01L 29/0692; H01L 29/045
See application file for complete search history.

(56) References Cited

U.S. PATENT DOCUMENTS

| | | | |
|---|---|---|---|
| 6,885,061 B2 | 4/2005 | Nakazawa et al. | |
| 2016/0260798 A1* | 9/2016 | Rupp | .................. H01L 29/4238 |
| 2017/0229551 A1* | 8/2017 | Nakanishi | ............. H01L 29/063 |
| 2017/0263754 A1* | 9/2017 | Soeno | ................. H01L 29/0619 |

FOREIGN PATENT DOCUMENTS

JP 2005-019734 A 1/2005

* cited by examiner

*Primary Examiner* — Ahmed N Sefer
(74) *Attorney, Agent, or Firm* — McDermott Will & Emery LLP

(57) ABSTRACT

The reliability of a semiconductor device is improved. A contact trench for coupling a field plate and a field limiting ring situated at the corner part of a semiconductor device is formed of a first straight line part and a second straight line part arranged line symmetrically with respect to the crystal orientation <011>. Respective one ends of the first straight line part and the second straight line part are coupled at the crystal orientation <011>, and the first straight line part and the second straight line part are set to extend in different directions from the crystal orientation <010> and the crystal orientation <011>.

13 Claims, 14 Drawing Sheets

FIG. 10
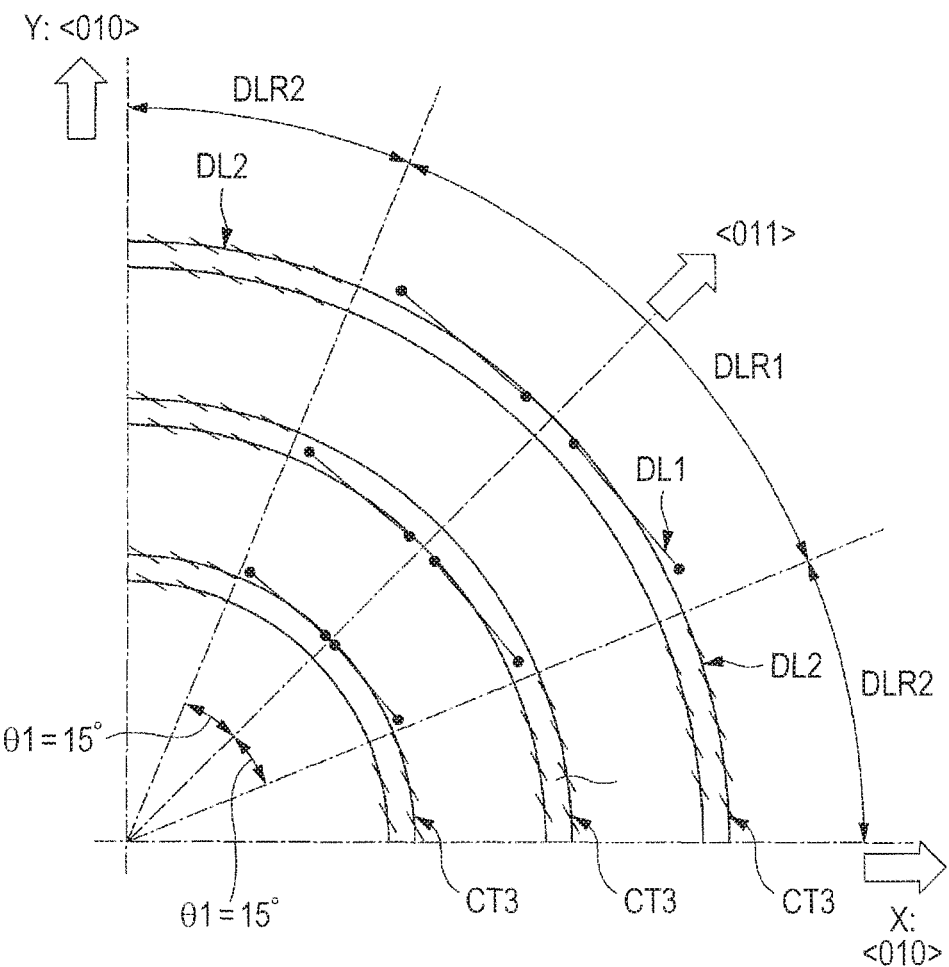
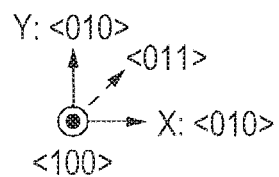

SEMICONDUCTOR DEVICE

CROSS-REFERENCE TO RELATED APPLICATIONS

The disclosure of Japanese Patent Application No. 2017-107956 filed on May 31, 2017 including the specification, drawings and abstract is incorporated herein by reference in its entirety.

BACKGROUND

The present invention relates to a semiconductor device, and is preferably applicable to, for example, a semiconductor device having a power transistor.

The semiconductor device having a power transistor has a cell formation region including a plurality of power transistors formed therein, and a termination region surrounding the periphery of the cell formation region.

Examples of the power transistor include a power MISFET having a trench gate, and an IGBT having a trench gate. Further, as the termination structures of the termination region, a field limiting ring, a field plate, and the like are known.

Japanese Unexamined Patent Application Publication No. 2005-19734 (Patent Document 1) describes a semiconductor device having a field limiting ring formed of a p type semiconductor region formed at a semiconductor substrate, and a field plate formed of a wire coupled therewith.

Patent Document

[Patent Document 1] Japanese Unexamined Patent Application Publication No. 2005-19734

SUMMARY

A semiconductor device having a power transistor is desired to be improved in reliability.

Other objects and novel features will be apparent from the description of this specification and the accompanying drawings.

In accordance with one embodiment, the contact trench for coupling the field plate and the field limiting ring situated at the corner part of the semiconductor device is formed of a first straight line part and a second straight line part arranged line symmetrically with respect to the crystal orientation <011>. Then, respective one ends of the first straight line part and the second straight line part are coupled at the crystal orientation <011>, and the first straight line part and the second straight line part are set to extend in different directions from the crystal orientation <010> and the crystal orientation <011>.

In accordance with one embodiment, the reliability of the semiconductor device can be improved.

BRIEF DESCRIPTION OF THE DRAWINGS

FIG. 10 is an essential part plan view of the semiconductor device of Study Example;

DETAILED DESCRIPTION

Figure 1:
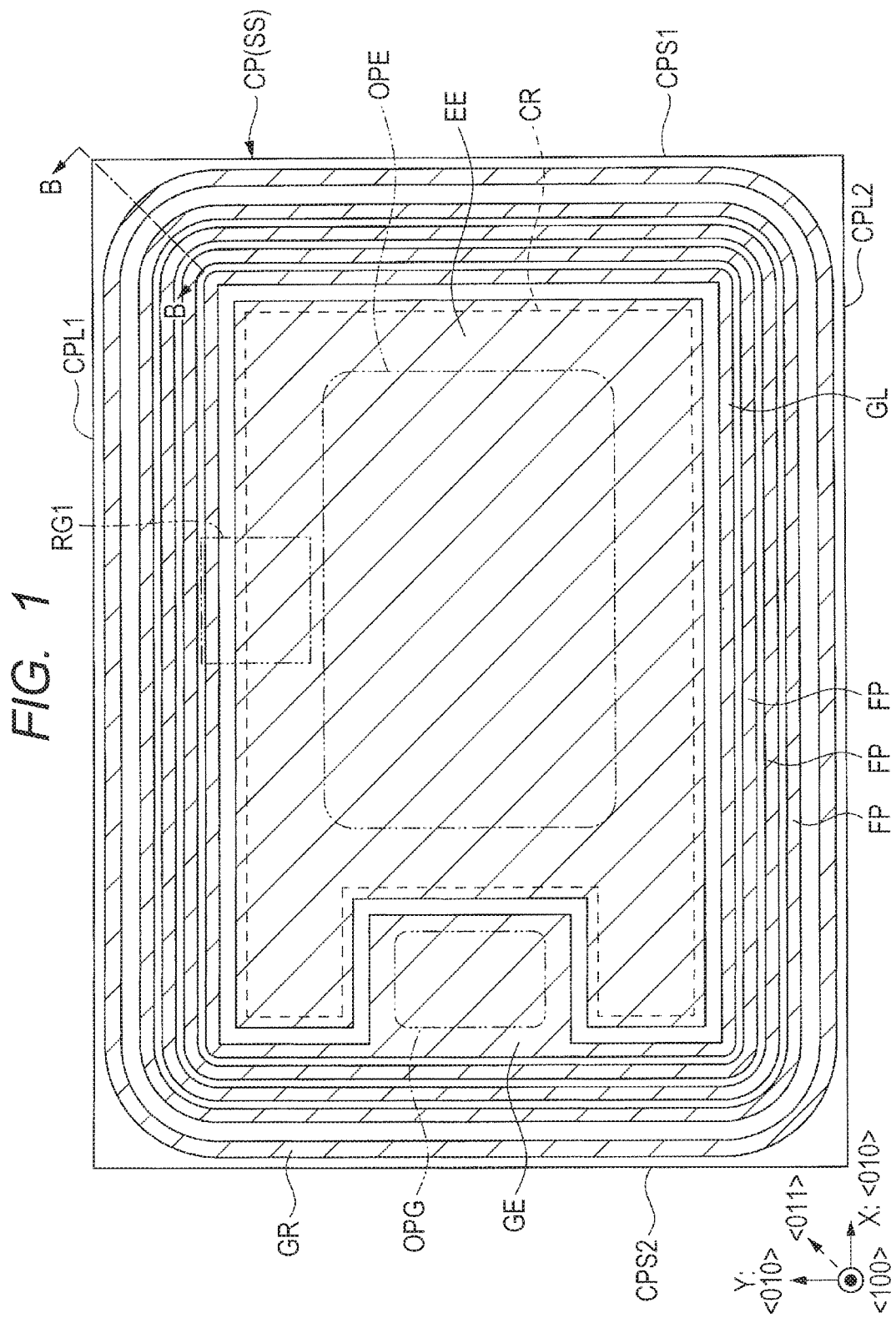
FIG. 1 is a plan perspective view of a semiconductor device of one embodiment.

In description of the following embodiment, the embodiment may be described in a plurality of divided sections or embodiments for convenience, required. However, unless otherwise specified, these are not independent of each other, but are in a relation such that one is a modified example, details, a complementary explanation, or the like of a part or the whole of the other. Further, in the following embodiments, when a reference is made to the number of elements, and the like (including number, numerical value, quantity, range, or the like), the number of elements, or the like is not limited to a specific number, but may be greater than or less than the specific number, unless otherwise specified, except for the case where the number is apparently limited to the specific number in principle, or except for other cases. Further, in the following embodiments, it is needless to say that the constituent elements (including element steps, or the like) are not always essential, unless otherwise specified, and except for the case where they are apparently considered essential in principle, or except for other cases. Similarly, in the following embodiments, when a reference is made to the shapes, positional relationships, or the like of the constituent elements, or the like, it is understood that they include ones substantially analogous or similar to the shapes or the like, unless otherwise specified, and unless otherwise considered apparently in principle, or except for other cases. This also applies to the foregoing numerical values and ranges.

Below, the embodiments will be described in details by reference to the accompanying drawings. Incidentally, in all the drawings for describing the embodiments, the members having the same function are given the same reference signs and numerals, and a repeated description thereon is omitted. Further, in the following embodiments, a description on the same or similar parts will not be repeated in principle unless otherwise required.

Further, in the drawings for use in the embodiments, hatching may be omitted even in cross sectional view for ease of understanding of the drawing. Whereas, hatching may be added even in plan view for ease of understanding of the drawing.

Whereas, in the following embodiments, the crystal orientation <100> includes crystallographically equivalent crystal orientations [100], [010], and the like. Further, the crystal plane {100} includes crystallographically equivalent crystal planes (100), (010), and the like.

EMBODIMENTS

Regarding Structure of Semiconductor Device

A semiconductor device of the present embodiment will be described by reference to the accompanying drawings.

Figure 2:
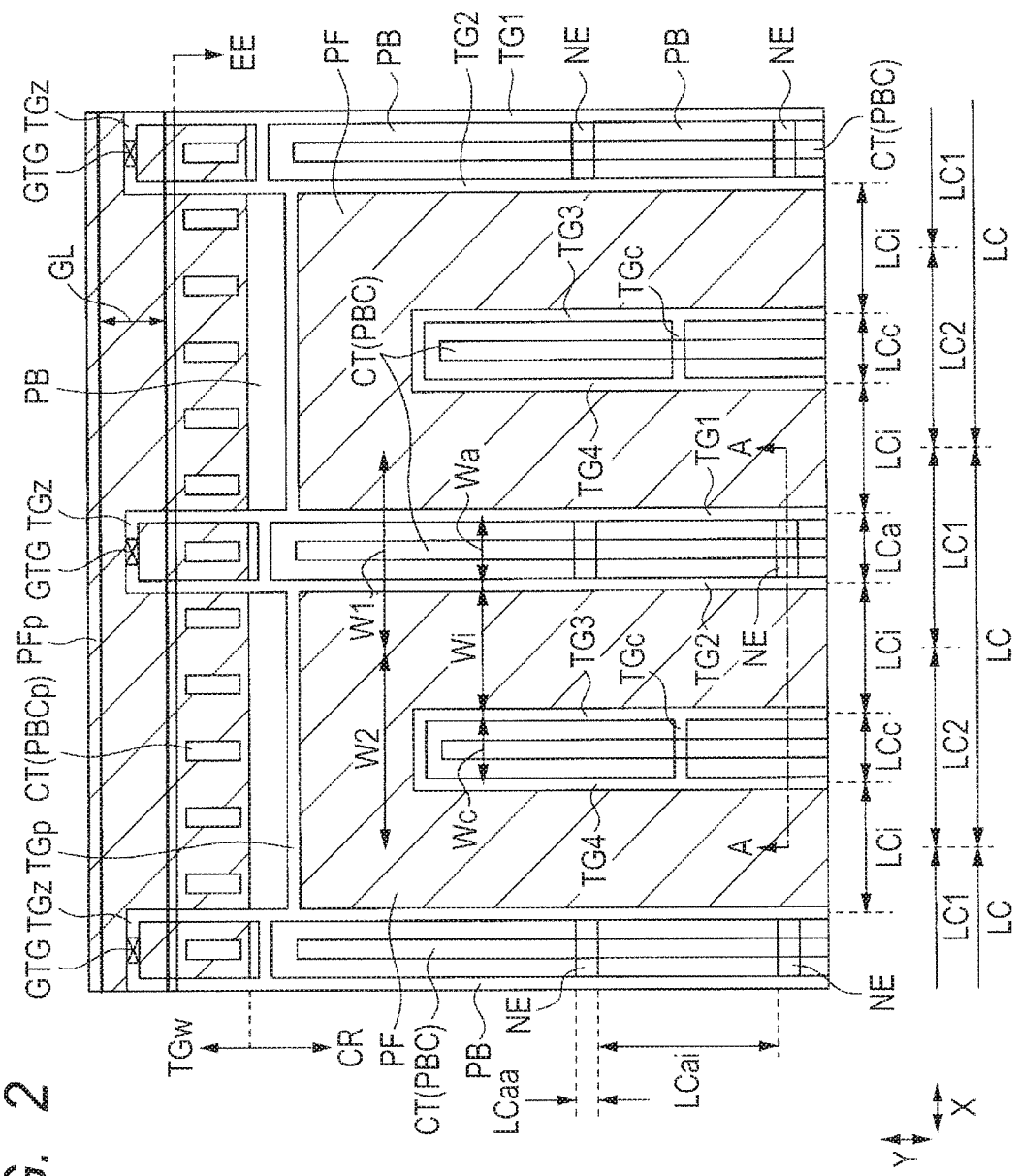
FIG. 2 is an essential part plan view of a semiconductor device of one embodiment.
Figure 3:
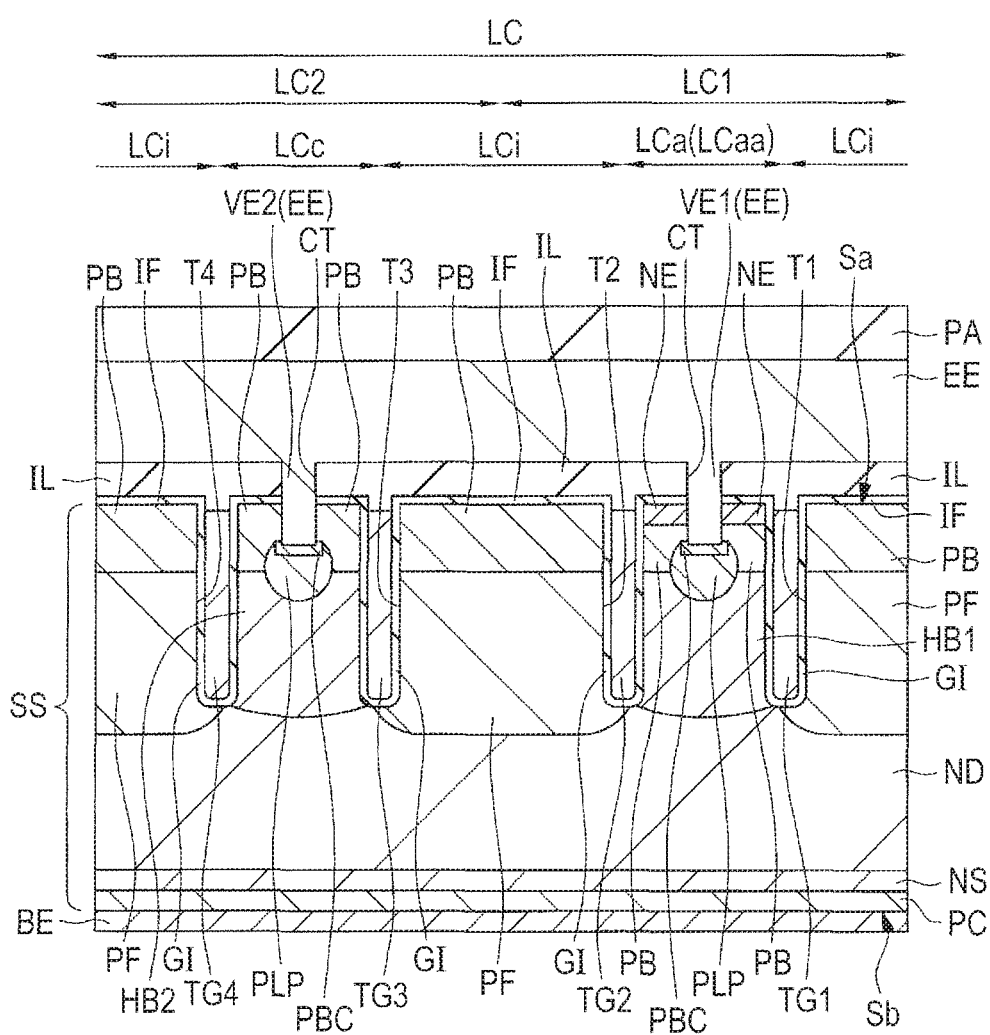
FIG. 3 is an essential part cross sectional view along line A-A of FIG. 2.
Figure 4:
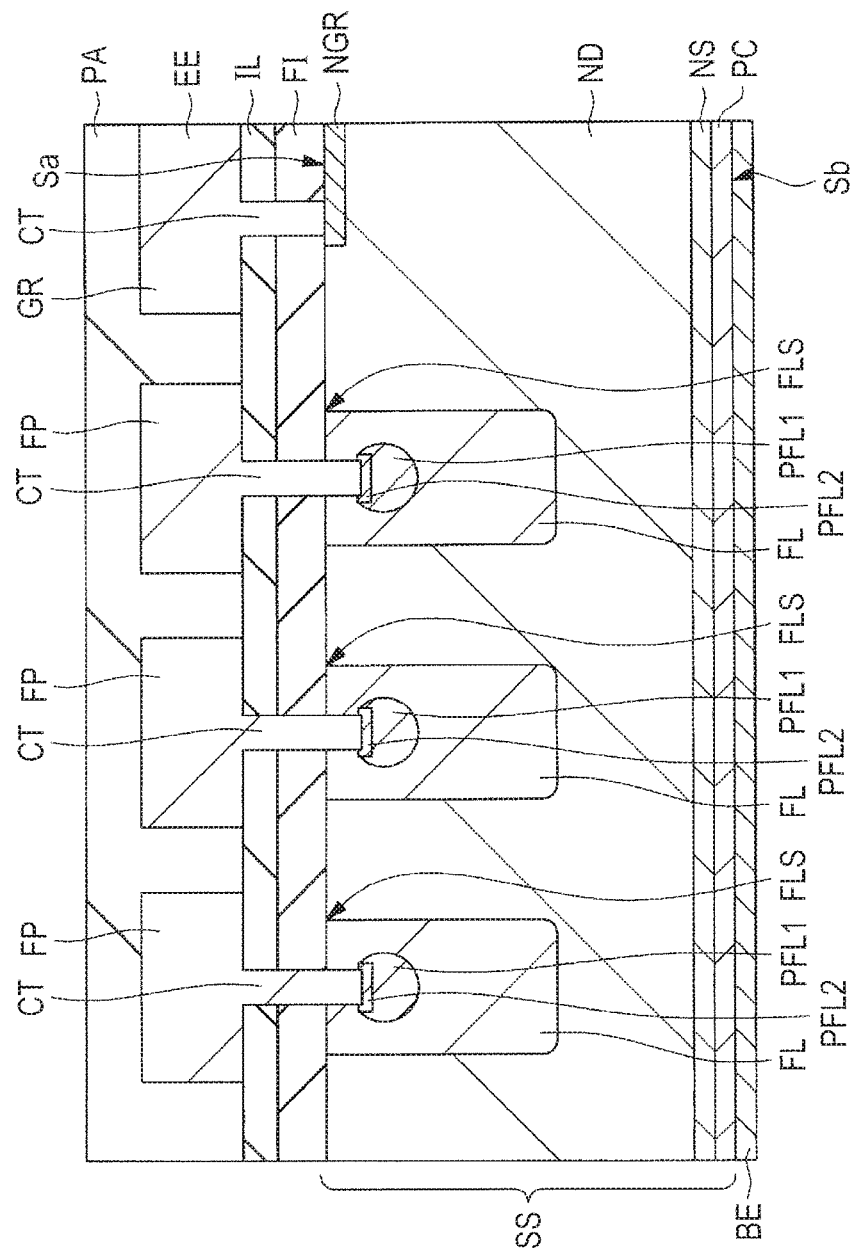
FIG. 4 is an essential part cross sectional view along line B-B of FIG. 1.

FIG. 1 is a plan perspective view of a semiconductor device (semiconductor chip) CP of the present embodiment, and shows a plan view as seen through an insulation film PA of a surface protective film. FIG. 2 is an essential part plan view of the semiconductor device Cr of the present embodiment, and is a partially enlarged plan view of a region RG1 shown in FIG. 1 on an enlarged scale. FIG. 3 is an essential part cross sectional view along line A-A of FIG. 2. FIG. 4 is an essential part cross sectional view along line B-B of FIG. 1.

As shown in FIG. 1, at the outer periphery of the main surface of the semiconductor device CP, an annular guard ring GR circulating along the outer periphery of the semiconductor device CP is formed. Inside the guard ring GR, an annular field plate FP circulating along the guard ring GR is formed. In the case of FIG. 1, three field plates FP are formed. However, not limited thereto, one or a plurality of the field plates FP can be formed. The field plate FP is coupled with an annular field limiting ring formed at the semiconductor substrate SS forming the semiconductor device CP. The field limiting ring is formed of an annular p type floating diffusion layer, and is provided immediately under the field plate FP. The field limiting ring and the field plate FP are electrically coupled with each other.

As shown in FIG. 1, at the main surface of the semiconductor device CP, inside the field plate FP, an emitter electrode (electrode for emitter) EE, a gate electrode (electrode for gate) GE, and a gate wire (wire for gate) GL are formed. The guard ring GR, the field plate FP, the emitter electrode EE, the gate electrode GE, and the gate wire GL are formed at mutually the same layer, and are formed over an interlayer insulation film (corresponding to an interlayer insulation film IL described later) formed over the semiconductor substrate SS. The guard ring GR, the field plate FP, the emitter electrode EE, the gate electrode GE, and the gate wire GL are each formed of a metal film including, for example, aluminum (Al) as the main component. The metal film including aluminum (Al) as the main component includes, for example, a trace amount of silicon (Si) or copper (Cu), or both thereof.

Inside the annular field plate FP in a plan view, and at the main part of the active part (active region) of the semiconductor substrate SS forming the semiconductor device CP, a cell formation region CR including an IGBT (Insulated Gate Bipolar Transistor) formed therein is provided. Over the cell formation region CR, the emitter electrode EE is arranged in such a manner as to cover the entire cell formation region CR. The emitter electrode EE is electrically coupled with the emitter of the IGBT formed in the cell formation region CR. In other words, in a plan view, the field plate FR and the guard ring GR continuously surround the periphery of the cell formation region CR.

Incidentally, the wordings such as "plan view" or "in a plan view" represents the view of the plane in parallel with the main surface of the semiconductor substrate SS.

The emitter electrode EE and the gate electrode GE are separated from each other, and the emitter electrode EE and the gate wire GL are separated from each other. On the other hand, the gate electrode GE and the gate wire GL are integrally formed. Therefore, the gate electrode GE and the gate wire GL are electrically coupled with each other. The width of the gate electrode GE is larger than the width of the gate wire GL.

Inside the annular field plate FP in a plan view, the gate wire GL is separated from the emitter electrode EE, and is arranged between the emitter electrode EE and the field plate FP. In the case of FIG. 1, in a plan view, the gate wire GL is arranged between the emitter electrode EE and the field plate FP in such a manner as to surround the periphery of the emitter electrode EE. The gate wire GL is electrically coupled with the gate (corresponding to a trench gate electrode TG1 or TG2 described later) of the IGBT formed in the cell formation region CR. Accordingly, the gate electrode GE is electrically coupled with the gate of the IGBT formed in the cell formation region CR via the gate wire GL.

At the uppermost layer on the upper surface side of the semiconductor device CP, an insulation film (final passivation film) PA as a surface protective film is formed. The guard ring GR and the field plate FP are entirely covered with the insulation film PA, and hence are not exposed. On the other hand, the emitter electrode EE is exposed at a part (central part) thereof from an emitter opening OPE of the insulation film PA, and an emitter bonding wire (external coupling terminal) is coupled with the exposed portion of the emitter electrode EE. Further, the gate electrode GE is exposed at a portion (central part) thereof from a gate opening OPG of the insulation film PA, and a gate bonding wire (external coupling terminal) is coupled with the exposed portion of the gate electrode GE. Further, as shown in FIG. 3, the uppermost layer on the back surface side of the semiconductor device CP is a back surface electrode BE, and the back surface electrode BE is formed at the entire back surface of the semiconductor device CP.

At the semiconductor substrate SS forming the semiconductor device CP, an IGBT is formed as a semiconductor element for controlling the conduction between the first terminal (emitter pad PDE) formed on the upper surface side of the semiconductor device CP and the second terminal (back surface electrode BE) formed on the back surface side of the semiconductor device CP. For this reason, for the semiconductor device CP, by controlling the IGBT formed at the semiconductor substrate SS, the conduction between the first terminal on the upper surface side and the second terminal on the back surface side is controlled. Accordingly, a current flows between the first terminal on the upper surface side and the second terminal on the back surface side. For this reason, the semiconductor device CP can be used as, for example, a switching element through which a large current flows. The gate electrode GE functions as a control terminal for controlling the conduction between the first terminal and the second terminal.

Incidentally, the outside of the cell formation region CR, particularly the region outside the gate wire GL is referred to as a termination region. In other words, in the termination region, the field plate FP, the field limiting ring, and the guard ring GR are formed. The field plate FP, the field limiting ring, and the guard ring GR each have a configuration continuously surrounding the periphery of the cell formation region CR. In other words, the field plate FP, the field limiting ring, and the guard ring GR each have an annular plan configuration circulating around the cell formation region CR.

Further, the plan configuration of the semiconductor device CP is substantially a rectangle. The semiconductor device CP has long sides CPL1 and CPL2 substantially in parallel with the X direction, and short sides CPS1 and CPS2 substantially in parallel with the Y direction. Then, the semiconductor device CP is formed at a single crystal silicon substrate. The main surface corresponds to the crystal plane {100} of the single crystal silicon substrate. Further, in FIG. 1, the long sides CPL1 and CPL2 extending in the X direction correspond to the crystal orientation <010>, and the short sides CPS1 and CPS2 extending in the Y direction orthogonal to the X direction also correspond to the crystal orientation <010>.

Structure of Cell Formation Region

Then, the internal structure of the semiconductor device CP will be described by reference to FIGS. 2 and 3.

As shown in FIG. 2, in the cell formation region CR, unit cell regions (linear unit cell regions) LC are arrayed periodically in the K direction. That is, a plurality of the unit cell regions LC are repeated in the X direction, to form the cell formation region CR. In other words, the unit cell region LC is the unit cell of the repeating units.

Each unit cell region LC includes a unit cell region (first linear unit cell region) LC1 and a unit cell region (second linear unit cell region) LC2. In the case of FIG. 2, the width W1 of the unit cell region LC1 is almost equal to the width W2 of the unit cell region LC2. Herein, the widths W1 and W2 are both the width (dimensions) in the X direction. The total of the width W1 of the unit cell region LC1 and the width W2 of the unit cell region LC2 corresponds to the width (dimension in the X direction) of the unit cell region LC.

Each unit cell region LC1 includes an active cell region (linear active cell region, or transistor cell region) LCa at the center, and a pair of half-width inactive cell regions (linear inactive cell regions) LCi surrounding this. (In the interface) between the active cell region LCa and the inactive cell region LCi, a trench gate electrode (first linear trench gate electrode) TG1 or a trench gate electrode (second linear trench gate electrode) TG2 electrically coupled with the gate wire GL is arranged. That is, in each active cell region LCa, the trench gate electrode TG1 extending in the Y direction (crystal orientation <010> direction) is arranged on one end side in the X direction, and the trench gate electrode TG2 extending in the Y direction (crystal orientation <010> direction) is arranged on the other end side in the X direction. In each active cell region LCa, the trench gate electrode TG1 and the trench gate electrode TG2 face to each other in the X direction.

On the other hand, each unit cell region LC2 includes a hole collector cell region (linear hole collector cell region, or a hole discharging cell region) LCc at the center, and a pair of half-width inactive cell regions LCi surrounding this. (In the interface) between the hole collector cell region LCc and the inactive cell region LCi, a trench gate electrode (third linear trench gate electrode) TG3 or a trench gate electrode (fourth linear trench gate electrode) TG4 electrically coupled with the emitter electrode EE is arranged. That is, in each hole collector cell region LCc, the trench gate electrode TG3 extending in the Y direction is arranged on one end side in the X direction, and the trench gate electrode TG4 extending in the Y direction is arranged on the other end side in the X direction. In each hole collector cell region LCc, the trench gate electrode TG3 and the trench gate electrode TG4 face to each other in the X direction.

Therefore, the unit cell region LC1 and the unit cell region LC2 adjacent to each other in the X direction share the inactive cell region LCi. The half (the half on the unit cell region LC1 side) of the inactive cell region LCi belongs to the unit cell region LC1, and the residual half (half on the unit cell region LC2 side) belongs to the unit cell region LC2. That is, in the unit cell region LC1 and the unit cell region LC2 adjacent to each other in the X direction, between the active cell region LCa of the unit cell region LC1 and the hole collector cell region LCc of the unit cell region LC2, the full-width inactive cell region LCi is interposed. The half-width portion of the full-width inactive cell region LCi belongs to the unit cell region LC1, and the residual half-width portion belongs to the unit cell region LC2. However, even when the inactive cell region LCi is divided into the half-width portion belonging to the unit cell region LC1, and the half-width portion belonging to the unit cell region LC2, a boundary or the like is not present therebetween, and the division is only made virtually.

Incidentally, in the case of FIG. 2, the width Wa of the active cell region LCa is almost equal to the width Wc of the hole collector cell region LCc. Further, the width Wa of the active cell region LCa and the width Wc of the hole collector cell region LCc are narrower smaller) than the width Wi of the inactive cell region LCi. Herein, any of the widths Wa, Wc, and Wi is the width (dimension) in the X direction.

Still further, in the case of FIG. 2, the active cell region LCa or the hole collector cell region LCc, and the inactive cell region LCi are alternately arrayed (arranged) in the X direction, to form the unit cell region LC.

In the active cell region LCa and the hole collector cell region LCc, a contact trench (opening) CT extending in the Y direction is provided at each central part in the X direction. The bottom of the contact trench CT reaches a p$^+$ type body contact region PBC formed at the semiconductor substrate SS.

Incidentally, the Y direction is the direction crossing with the X direction, and the Y direction is preferably the direction orthogonal to the X direction. The X direction is the direction of repetition of the unit cell region LC. The Y direction is each longitudinal direction (long side direction or extension direction) of the unit cell region LC, the unit cell region LC1, the unit cell region LC2, the active cell region LCa, the hole collector cell region LCc, the inactive cell region LCi, the contact trench CT, and the trenches T1, T2, T3, and T4. For this reason, all of the unit cell region LC, the unit cell region LC1, the unit cell region LC2, the active cell region LCa, the hole collector cell region LCc, the inactive cell region LCi, the contact trench CT, and the trenches T1, T2, T3, and T4 extend in the Y direction.

In the active cell region LCa, regions (plan regions) including n$^+$ type emitter regions NE formed periodically in the Y direction therein, namely, active sections LCaa, and regions (plan regions) not including n$^+$ type emitter regions NE formed therein, namely, inactive sections LCai are alternately provided.

In the hole collector cell region LCc, connecting trench gate electrodes (emitter coupling parts) TGc for mutually coupling the trench gate electrode (trench electrode) TG3 and the trench gate electrode (trench electrode) TG4 are provided periodically in the Y direction.

In each hole collector cell region LCc, the trench gate electrode TG3 and the trench gate electrode TG4 respectively extend in the Y direction, and are separated from each other in the direction, and the connecting trench gate electrode TGc is formed integrally with the trench gate electrode TG3 and the trench gate electrode TG4, and extends in the X direction in such a manner as to couple the trench gate electrode TG3 and the trench gate electrode TG4. Accordingly, in each hole collector cell region LCc, the trench gate electrode TG3 and the trench gate electrode TG4 are integrally formed via the connecting trench gate electrode TGc, and are electrically coupled with each other via the connecting trench gate electrode TGc.

In each hole collector cell region LCc, a contact trench CT extending in the Y direction is arranged between the trench gate electrode TG3 extending in the Y direction and the trench gate electrode TG4 extending in the Y direction. For this reason, in each hole collector cell region LCc, the contact trench CT crosses with the connecting trench gate electrode TGc. At the crossing part, the connecting trench gate electrode TGc is electrically coupled with the emitter electrode EE. As a result, in each hole collector cell region LCc, the trench gate electrode TG3 and the trench gate electrode TG4 are electrically coupled with each other via the connecting trench gate electrode TGc, and are electrically coupled with the emitter electrode EE via the connecting trench gate electrode TGc.

The trench gate electrodes TG1 and TG2 each function as the gate electrode of a field effect transistor. However, the trench gate electrodes TG3 and TG4 each do not function as the gate electrode of a field effect transistor, and are each a so-called dummy trench gate electrode. The trench gate electrodes TG3 and TG4 are buried in the trenches T3 and T4, and hence can be regarded as trench electrodes.

In the inactive cell region LCi, a p type floating region (p type semiconductor region) PF is provided. FIG. 2 is a plan view. However, for ease of understanding, the p type floating region PF and a p type floating region PFp described later are hatched.

In some portion of the outside of the periphery of the cell formation region CR, for example, a p type floating region (p type semiconductor region) PFp is provided in such a manner as to surround the cell formation region CR. The p type floating region PFp is electrically coupled with the emitter electrode EE by the contact trench CT (p$^+$ type body contact region PBCp) arranged at a position overlying the p type floating region PFp in a plan view.

Further, outside the periphery of the cell formation region CR, for example, a gate wire GL is arranged. Toward the gate wire GL, the trench gate electrode TG1 and the trench gate electrode TG2 extend from the inside of the cell formation region CR. Accordingly, the trench gate electrode TG1 and the trench gate electrode TG2 mainly extend in the Y direction in the cell formation region CR, and further extend to the outside of the periphery of the cell formation region CR. Then, outside the periphery of the cell formation region CR (gate lead-out part TGw), the end of the trench gate electrode TG1 in the Y direction and the end of the trench gate electrode TG2 in the Y direction are connected via the end connecting trench gate electrode (gate coupling part) TGz extending in the X direction. The end connecting trench gate electrode TGz is formed integrally with the trench gate electrode TG1 and the trench gate electrode TG2, and extends in the X direction in such a manner as to connect the trench gate electrode TG1 and the trench gate electrode TG2. For this reason, the trench gate electrode TG1 and the trench gate electrode TG2 are electrically coupled with each other via the end connecting trench gate electrode TGz.

The end connecting trench gate electrode TGz overlaps the gate wire GE in a plan view. Then, the end connecting trench gate electrode TGz, is electrically coupled with the gate wire GL via a coupling part (gate wire—trench gate electrode coupling part) GTG provided at a position overlapping the end connecting trench gate electrode TGz in a plan view. The coupling part GTG includes a contact hole formed in the interlayer insulation film IL and the gate wire GL buried in the contact hole. That is, a portion of the gate wire GL buried in the contact hole formed in the interlayer insulation film IL is coupled with the end connecting trench gate electrode TGz. As a result, the trench gate electrode TG1 and the trench gate electrode TG2 are electrically coupled with the gate wire GL.

Further, the part between the inactive cell region LCi and the outside of the periphery of the cell formation region CR is defined by the end trench gate electrode TGp. The end trench gate electrode TGp is integrally formed with the trench gate electrode TG1 and the trench gate electrode TG2.

Therefore, the trench gate electrodes TG1 and TG2 of the plurality of unit cell regions LC formed in the cell formation region CR are electrically coupled with each other, respectively, and are electrically coupled with the common gate wire GL, and further, electrically coupled with the gate electrode GE via the gate wire GL. Further, the trench gate electrodes TG3 and TG4 of the plurality of unit cell regions LC formed in the cell formation region CR are electrically coupled with each other, respectively, and are electrically coupled with the common emitter electrode EE.

Then, the cross sectional structure of the semiconductor device CP will be described by reference to FIG. 3.

As shown in FIG. 3, the semiconductor substrate SS forming the semiconductor device CP is formed of an n type single crystal silicon doped with an n type impurity such as phosphorus (P). The semiconductor substrate SS has a surface Sa of one main surface, and a back surface Sb of the main surface opposite to the surface Sa.

At the bottom of the semiconductor substrate SS, namely, on the back surface Sb side of the semiconductor substrate SS, a p$^+$ type collector layer (p$^+$ type collector region or p$^+$ type semiconductor region) PC with a prescribed thickness is formed. The p$^+$ type collector layer PC is a p type semiconductor region (semiconductor layer) doped with a p type impurity, and can be formed at the entire back surface Sb of the semiconductor substrate SS. Then, entirely over the back surface Sb of the semiconductor substrate SS, a back surface electrode (collector electrode) BE is formed in such a manner as to be in contact with the p$^+$ type collector layer PC. The back surface electrode BE is a collector electrode.

Further, in the semiconductor substrate SS, an n type field stop layer (n type semiconductor region) NS is formed on the side of the p$^+$ type collector layer PC opposite to the side thereof adjacent to the back surface electrode BE in such a manner as to be in contact with the V type collector layer PC. The n type field stop layer NS is an n type semiconductor region (semiconductor layer) doped with an n type impurity, and has a higher impurity density than that of the n$^-$ type drift region ND. For this reason, the p$^+$ type collector layer PC is in contact with the back surface electrode BE, and is adjacent to the n type field stop layer NS on the side opposite to the side thereof adjacent to the back surface electrode BE. In the semiconductor substrate SS, the lamination structure of the p$^+$ type collector layer PC and the n type field stop layer NS can be formed entirely at the back surface Sb of the semiconductor substrate SS.

Although the n type field stop layer NS can be omitted, the n type field stop layer NS can function as a field stop layer for preventing the depletion layer extending from the surface side of the semiconductor substrate SS from reaching the p$^+$ type collector layer PC. For this reason, the n type field stop layer NS is more preferably formed. When the n type field stop layer NS is omitted, the upper surface (the surface opposite to the side thereof adjacent to the back surface electrode BE) of the p⁺ type collector layer PC is in contact with the n⁻ type drift region ND.

The back surface electrode BE can be formed of, for example, a lamination film of an aluminum (Al) layer, a titanium, (Ti) layer, a nickel (Ni) layer, and a gold (Au) layer sequentially from the back surface Sb of the semiconductor substrate SS. The back surface electrode BE is in contact with the p⁺ type collector layer PC, and the back surface electrode BE and the p⁺ type collector layer PC are electrically coupled with each other.

As shown in FIG. 3, the n⁻ type drift region ND as an n type semiconductor region occupies the main part of the semiconductor substrate SS. That is, the n⁻ type drift region ND is formed in the region except for the lower layer part and the upper layer part in the semiconductor substrate SS. The impurity density of the n⁻ type drift region ND is lower than respective impurity densities of the n type field stop layer NS, the n⁺ type emitter region NE, the n type hole barrier region HB1, and the n type hole barrier region HB2. The upper surface (the surface opposite to the side thereof adjacent to the p⁺ type collector layer PC) of the n type field stop layer NS is adjacent to the bottom surface (lower surface) of the n⁻ type drift region ND. That is, the n type field stop layer NS is interposed between the n⁻ type drift region ND and the p⁺ type collector layer PC.

A p type body region (p type semiconductor region or p type semiconductor layer) PB is formed almost entirely in the cell formation region CR on the surface Sa side of the semiconductor substrate SS, namely, at the upper layer part of the semiconductor substrate SS. The p type body region PB is a p type semiconductor region (semiconductor layer) doped with a p type impurity. The depth (depth position) of the p type body region PB is shallower than each depth (depth position) of the trenches T1, T2, T3, and T4.

Incidentally, the term "depth" or "depth position" corresponds to the distance from the surface Sa of the semiconductor substrate SS with the surface Sa of the semiconductor substrate SS as the reference plane (distance in the direction perpendicular to the main surface of the semiconductor substrate SS). Then, the side closer to the surface Sa of the semiconductor substrate SS is assumed to be the shallower side, and the side distant from the surface Sa of the semiconductor substrate SS (in other words, the side closer to the back surface Sb of the semiconductor substrate SS) is assumed to be the deeper side.

In the semiconductor substrate SS, the trenches T1, T2, T3, and T4 extending from the surface Sa in the depth direction (thickness direction) of the semiconductor substrate SS are formed. In the trenches T1, T2, T3, and T4, trench gate electrodes (gate electrodes or trench type gate electrodes) TG1, TG2, TG3, and TG4 are buried via the gate insulation films GI, respectively. The trenches T1, T2, T3, and T4 are formed on the surface Sa side of the semiconductor substrate SS, and do not penetrate through the semiconductor substrate SS. Each bottom surface of the trenches T1, T2, T3, and T4 is situated midway of the thickness of the semiconductor substrate SS. The depth of the bottom surface of the trench T1, the depth of the bottom surface of the trench T2, the depth of the bottom surface of the trench T3, and the depth of the bottom surface of the trench T4 are almost equal to one another.

At each bottom surface and side surface of the trenches T1, T2, T3, and T4 formed at the semiconductor substrate SS, the gate insulation film GI formed of an insulation film such as a silicon oxide film is formed. For this reason, the gate insulation film GI is interposed between the trench gate electrodes TG1, TG2, TG3, and TG4 buried in the trenches T1, T2, T3, and T4, respectively, and the semiconductor substrate SS. The trench gate electrodes TG1, TG2, TG3, and TG4 are formed of conductive films buried in the trenches T1, T2, T3, and T4 of the semiconductor substrate SS, respectively, and are each formed of, for example, a doped polysilicon film (a doped polysilicon film doped with, for example, phosphorus).

In each active cell region LCa, the trench T1, and the trench gate electrode TG1 buried in the trench T1 are arranged on one end side in the X direction, and the trench T2 and the trench gate electrode TG2 buried in the trench T2 are arranged on the other end side in the X direction. The trenches T1 and T2, and the trench gate electrodes TG1 and TG2 buried therein extend in the Y direction. The trench gate electrode TG1 and the trench gate electrode TG2 are, as described above, electrically coupled with each other, and are electrically coupled with the gate wire GL and the gate electrode GE.

In each hole collector cell region LCc, the trench T3, and the trench gate electrode TG3 buried in the trench T3 are arranged on one end side in the X direction, and the trench T4 and the trench gate electrode TG4 buried in the trench T4 are arranged on the other end side in the X direction. The trenches T3 and T4, and the trench gate electrodes TG3 and TG4 buried therein extend in the Y direction. The trench gate electrode TG3 and the trench gate electrode TG4 are, as described above, electrically coupled with each other, and are electrically coupled with the emitter electrode EE.

In the active section LCaa in the active cell region LCa, on the surface Sa side of the semiconductor substrate SS, the n⁺ type emitter region (n⁺ type semiconductor region) NE is formed. That is, the n⁺ type emitter region NE is formed at the top (upper layer part) of the p type body region PB. The n⁺ type emitter region NE is an n type semiconductor region doped with an n type impurity. As described above, in the active section LCaa in the active cell region LCa, the n⁺ type emitter region NE s formed. However, in the inactive section LCai in the active cell region LCa, the n⁺ type emitter region NE is not formed (see FIG. 2).

Over the surface Sa of the semiconductor substrate SS, the interlayer insulation film IL formed of a silicon oxide film or the like is formed almost entirely at the surface Sa of the semiconductor substrate SS. The trench gate electrodes TG1, TG2, TG3, and TG4 are covered with the interlayer insulation IL. Over the interlayer insulation film IL, the emitter electrode EE formed of a metal film including, for example, aluminum (Al) as the main component is formed. Over the interlayer insulation film IL, an insulation film (final passivation film) PA of a surface protective film is formed in such a manner as to cover the emitter electrode EE. The insulation film PA is formed of, for example, a polyimide type organic insulation film (resin film).

The contact trench CT penetrates through the interlayer insulation film IL, and further digs into a part of the semiconductor substrate SS. In other words, the contact trenches CT are formed in the interlayer insulation film IL and the semiconductor substrate SS. Then, the bottom surface of the contact trench CT is deeper than the interface between the n⁺ type emitter region NE and the p type body region PB. In the active cell region LCa, the contact trench CT is formed between the trench T1 and the trench T2 adjacent to each other in the X direction, and accordingly is formed between the trench gate electrode TG1 and the trench gate electrode TG2 adjacent to each other in the X direction. Further, in the hole collector cell region LCc, the contact trench CT is formed between the trench T3 and the trench T4 adjacent to each other in the X direction, and accordingly, is formed between the trench gate electrode TG3 and the trench gate electrode TG4 adjacent to each other in the X direction.

At the semiconductor substrate SS in the active cell region LCa, at a position adjacent to the bottom surface of the contact trench CT, namely, under the bottom surface of the contact trench CT, a $p^+$ type body contact region ($p^+$ type semiconductor region) PBC is formed. Under the $p^+$ type body contact region PBC, a $p^+$ type latch-up prevention region ($p^+$ type semiconductor region) PLP is formed in such a manner as to be in contact with the $p^+$ type body contact region PBC. The $p^+$ type body contact region PBC, the $p^+$ type latch-up prevention region PLP, and the p type body region PB formed in the active cell region LCa are electrically coupled with one another. In other words, as shown in FIG. 3, in the active section LCaa in the active cell region LCa, the $n^+$ type emitter region NE, the $p^+$ type body contact region PBC, the $p^+$ type latch-up prevention region PLP, and the p type body region PB are coupled with the emitter electrode EE. In other words, a coupling electrode VE1 (a part of the emitter electrode EE) buried in the contact trench CT is in contact with, and is electrically coupled with the p type body region PB and the $n^+$ type emitter region NE at the side surface of the contact trench CT, and is in contact with and is electrically coupled with the $p^+$ type body contact region PBC at the bottom surface of the contact trench CT.

Whereas, also at the semiconductor substrate SS in the hole collector cell region LCc, at a position adjacent to the bottom surface of the contact trench CT, namely, under the bottom surface of the contact trench CT, a $p^+$ type body contact region PBC is formed. Under the $p^+$ type body contact region PBC, a $p^+$ type latch-up prevention region ($p^+$ type semiconductor region) PLP is formed in such a manner as to be in contact with the $p^+$ type body contact region PBC. The $p^+$ type body contact region PBC, the $p^+$ type latch-up prevention region PLP, and the p type body region PB formed in the hole collector cell region LCc are electrically coupled with one another. In other words, as shown in FIG. 3, in the hole collector cell region LCc, the $p^+$ type body contact region PBC, the $p^+$ type latch-up prevention region PLP, and the p type body region PB are coupled with the emitter electrode EE. In other words, a coupling electrode VE2 (a part of the emitter electrode EE) buried in the contact trench CT is in contact with, and is electrically coupled with the p type body region PB at the side surface of the contact trench CT, and is in contact with, and is electrically coupled with the $p^+$ type body contact region PBC at the bottom surface of the contact trench CT.

The $p^+$ type body contact region PBC and the $p^+$ type latch-up prevention region PLP are each a p type semiconductor region doped with a p type impurity. The impurity density of the $p^+$ type latch-up prevention region PLP is higher than the impurity density of the p type body region PB. Whereas, the impurity density of the $p^+$ type body contact region PBC is higher than the impurity density of the $p^+$ type latch-up prevention region PLP.

As described previously, the part of the emitter electrode EE buried in the contact trench CT formed in the active cell region LCa is referred to as the coupling electrode VE1, and the part of the emitter electrode EE buried in the contact trench CT formed in the hole collector cell region LCc is referred to as the coupling electrode VE2. The coupling electrode VE1 is buried in the contact trench CT formed in the active cell region LCa. The coupling electrode VE2 is buried in the contact trench CT formed in the hole collector cell region LCc. The coupling electrode VE1 and the coupling electrode VE2 are both integrally formed with the emitter electrode EE, respectively. For this reason, the coupling electrodes VE1 and VE2 are electrically coupled with the emitter electrode EE.

As another aspect, the coupling electrodes VE1 and VE2 may be each formed of a different metal film from that of the emitter electrode EE.

In the semiconductor substrate SS in the active cell region LCa, under the $p^+$ type latch-up prevention region PLP and the p type body region PB, an n type hole barrier region (n type semiconductor region) HB1 is formed. Further, in the semiconductor substrate SS in the hole collector cell region LCc, under the $p^+$ type latch-up prevention region PLP and the p type body region PB, an n type hole barrier region (n type semiconductor region) HB2 is formed. Under the n type hole barrier regions HB1 and HB2, an $n^-$ type drift region ND is present. Respective bottom surfaces (lower surfaces) of the n type hole barrier regions HB1 and HB2 are in contact with the $n^-$ type drift region ND.

The n type hole battier region HB1 and the n type hole barrier region HB2 are both n type semiconductor regions doped with an n type impurity. The depth of the bottom surface of the n type hole barrier region HB1 is roughly equal to the depth of the bottom surfaces of the trenches T1 and T2. Whereas, the depth of the bottom surface of the n type hole barrier region HB2 is roughly equal to the depth of the bottom surfaces of the trenches T3 and T4.

The impurity density of the n type hole barrier region HB1 formed in the active cell region LCa is higher than the impurity density of the type drift region ND under the n type hole barrier region HB1, and lower than the impurity density of the $n^+$ type emitter region NE. Whereas, the impurity density of the n type hole barrier region HB2 formed in the hole collector cell region LCc is higher than the impurity density of the $n^-$ type drift region ND situated under the n type hole barrier region HB2.

In the inactive cell region LCi, on the surface Sa side of the semiconductor substrate SS, a p type floating region (p type semiconductor region) PF is formed under the p type body region PB. The p type floating region PF is a p type semiconductor region doped with a p type impurity. The upper surface of the p type floating region PF is in contact with the bottom surface of the p type body region PB.

The cross sectional structure of the active section Lcaa in the active cell region LCa (corresponding to the cross sectional structure of the active cell region LCa of FIG. 3) will be summarized as follows.

That is, in the semiconductor substrate SS in the region interposed between the trench T1 and the trench T2, the $n^+$ type emitter region NE is formed at the uppermost layer part, the p type body region PB is formed under the $n^+$ type emitter region NE, and the n type hole barrier region HEB1 is formed under the p type body region PB. The $n^+$ type emitter region NE, the p type body region PB, and the n type hole barrier region HB1 are adjacent to the side surface of the trench T1 (or the trench T2). In the region adjacent to the side surface of the trench T1 (or the trench T2), the p type body region PB is interposed between the $n^+$ type emitter region NE and the n type hole barrier region HB1.

Under then type hole barrier region HB1, the $n^-$ type drift region ND is present. Under the $n^-$ type drift region ND, the n type field stop layer NS is formed. Under the n type field stop layer NS, the $p^+$ type collector layer PC is formed. The $p^+$ type collector layer PC is the lowermost layer in the semiconductor substrate SS. Over the back surface Sb of the semiconductor substrate SS, a back surface electrode EE is formed in such a manner as to be in contact with the $p^+$ type collector layer PC. In the trench T1 formed in the semiconductor substrate SS, the trench gate electrode TG1 is formed via the gate insulation film GI. In the trench T2 formed in the semiconductor substrate SS, the trench gate electrode TG2 is formed via the gate insulation film GI. The trench gate electrode TG1 and the trench gate electrode TG2 respectively face to the $n^+$ type emitter region NE, the p type body region PB, and the n type hole barrier region HB1 via the gate insulation film GI.

In the interlayer insulation film IL formed over the surface Sa of the semiconductor substrate SS in such a manner as to cover the trench gate electrodes TG1 and TG2, the contact trench CT is formed between the trench T1 and the trench T2 in a plan view. The contact trench CT not only penetrates through the interlayer insulation film IL, but also digs into a part of the semiconductor substrate SS in the semiconductor substrate SS in the region interposed between the trench T1 and the trench T2. Specifically, the contact trench CT penetrates though the $n^+$ type emitter region NE, and the bottom surface of the contact trench CT is situated midway in the thickness of the p type body region PB. The depth position of the bottom surface of the contact trench CT is deeper than that of the upper surface of the p type body region PB (i.e., the pn junction surface between the $n^+$ type emitter region NE and the p type body region PB), and shallower than that of the bottom surface of the p type body region PB (i.e., the pn junction surface between the p type body region PB and the n type hole barrier region HB1).

The $p^+$ type body contact region PBC and the $p^+$ type latch-up prevention region PLP are preferably formed. However, one or both of them may be omitted. The coupling electrode VE1 is electrically coupled with each of the p type body region PB and the $n^+$ type emitter region NE irrespective of whether the $p^+$ type body contact region PBC and the $p^+$ type latch-up prevention region PLP are omitted or not.

The cross sectional structure of the inactive section LCai the active cell region LCa is the same as the cross sectional structure of the active section LCaa in the active cell region LCa, except that the $n^+$ type emitter region NE is not provided.

In the cross sectional structure of the hole collector cell region in the semiconductor substrate SS in the region interposed between the trenches (T3 and T4), the $n^+$ type emitter region NE is not provided, and the p type body region PB is formed up to the surface Sa. Then, over the p type body region PB, the n type semiconductor region (n type emitter region) electrically coupled with the emitter electrode EE is not formed.

However, in the cross sectional structure of the hole collector cell region LCc of FIG. 3, the n type hole barrier region HB2 having a higher impurity density than that of the n type hole barrier region HB1 is formed in place of the n type hole barrier region HB1. However, the impurity density of the n type hole barrier region HB2 may be set equal to the impurity density of the n type hole barrier region HB1. In the trenches T3 and T4 in the hole collector cell region LCc, the trench gate electrodes TG3 and TG4 electrically coupled with the emitter electrode EE are buried via the gate insulation film GI, respectively.

That is, as shown in FIG. 3, in the hole collector cell region LCc, in the semiconductor substrate SS in the region interposed between the trench T3 and the trench T4, the p type body region PB is formed up to the surface Sa, and the n type hole barrier region HB2 is formed under the p type body region PB. Under the n type hole barrier region HB2, the $n^-$ type drift region ND is present. Under the $n^-$ type drift region ND, the n type field stop layer NS is formed. Under the n type field stop layer NS, the $p^+$ type collector layer PC is formed. The $p^+$ type collector layer PC is the lowermost layer in the semiconductor substrate SS. The back surface electrode EE is formed over the back surface Sb of the semiconductor substrate SS in such a manner as to be in contact with the $p^+$ type collector layer PC. In the trench T3 formed in the semiconductor substrate SS, the trench gate electrode TG3 is formed via the gate insulation film GI. In the trench T4 formed in the semiconductor substrate SS, the trench gate electrode TG4 is formed via the gate insulation film GI.

In the interlayer insulation film IL formed over the surface Sa of the semiconductor substrate SS in such a manner as to cover the trench gate electrodes TG3 and TG4, the contact trench CT is arranged between the trench T3 and the trench T4 in a plan view. The contact trench CT not only penetrates through the interlayer insulation film IL, but also digs into a part of the semiconductor substrate SS in the semiconductor substrate SS in the region interposed between the trench T3 and the trench T4. The bottom surface of the contact trench CT is situated midway in the thickness of the p type body region PB. The depth position of the bottom surface of the contact trench CT is deeper than that of the upper surface of the p type body region PB (i.e., the surface of the semiconductor substrate SS), and shallower than that of the bottom surface of the p type body region PB (i.e., the pn junction surface between the p type body region PB and the n type hole barrier region HB2).

Structure of Termination Region

Then, the structure of the termination region surrounding the outside of the cell formation region CR will be described by reference to FIGS. 1 and 4. FIG. 4 is an essential part cross sectional view along line B-B of FIG. 1.

As shown in FIG. 4, in the termination region, a plurality of field limiting rings FL, a plurality of field plates FP, and a guard ring GR are formed. In the semiconductor substrate SS, a plurality of (three in FIG. 4) field rings (p type semiconductor regions) FL are formed at equal intervals. The field limiting ring FL is a p type semiconductor region formed in the $n^-$ type drift region ND of the semiconductor substrate SS, and has the same impurity density and depth as those of the p type floating region PF in the cell formation region CR.

In the inside of the field limiting ring FL, a p type semiconductor region PFL1 is formed. In the inside of the p type semiconductor region PFL1, a p type semiconductor region PFL2 is formed. The p type semiconductor region PFL1 has the same impurity density and depth as those of the $p^+$ type latch-up prevention region PLP in the cell formation region CR. The p type semiconductor region PFL2 has the same impurity density and depth as those of the $p^+$ type body contact region PBC in the cell formation region CR. In other words, the impurity density of the p type semiconductor region PFL2 is higher than the impurity density of the p type semiconductor region PFL1. The impurity density of the p type semiconductor region PFL1 is higher than the impurity density of the field limiting ring FL. Further, the p type semiconductor region PFL1 and the p type semiconductor region PFL2 are formed at a deeper position than that of the surface Sa of the semiconductor substrate SS (i.e., the position reduced in height from the surface Sa toward the back surface Sb side).

Over the surface Sa of the semiconductor substrate SS, a plurality of field plates FP and the guard ring GR are formed via the field insulation film FI and the interlayer insulation film IL. The field plates FP and the guard ring CR are each formed of the same metal film as that of the emitter electrode EE in the cell formation region CR, and each have the same material and film thickness.

In the field insulation film FI, the interlayer insulation film IL, and the semiconductor substrate SS, the contact trench CT is formed. The contact trench CT penetrates through the field insulation film FI and the interlayer insulation film IL, further digs into a part of the semiconductor substrate SS, and reaches the p type semiconductor region PFL2. Then, in the contact trench CT, a metal film forming the field plate FP is formed, and is in contact with the p type semiconductor region PFL2. In other words, the field limiting ring FL, the p type semiconductor region PFL1, and the p type semiconductor region PFL2 are electrically coupled with the field plate FP. Incidentally, the p type semiconductor region PFL1 and the p type semiconductor region PFL2 are formed for an ohmic contact between the field plate FP and the field limiting ring FL, and one of them may be omitted.

Further, the guard ring GR is coupled with an $n^+$ type semiconductor region NGR formed in the $n^-$ type drift region ND of the semiconductor substrate SS. In other words, the guard ring GR is electrically coupled with the $n^-$ type drift region ND. The $n^+$ type semiconductor region NGR has the same impurity density and depth as those of the $n^+$ type emitter region NE in the cell formation region CR. The $n^+$ type semiconductor region NGR also has an annular plan configuration circulating around the cell formation region CR outside the field limiting ring FL.

Thus, provision of the multiple field limiting ring FL allows the depletion layer to extend in a direction from the cell formation region CR (see FIG. 1) not shown situated on the left side of FIG. 4 toward the guard ring GR. For this reason, the electric field associated with the high voltage to be applied to the cell formation region CR can be relaxed.

Further, as shown in FIG. 4, the boundary between the field limiting ring FL and the $n^-$ type drift region ND is covered with the field plate FP coupled with the limiting ring FL. For this reason, the electric field at the shoulder part FLS of the field limiting ring FL can be relaxed.

Study Example

Figure 9:
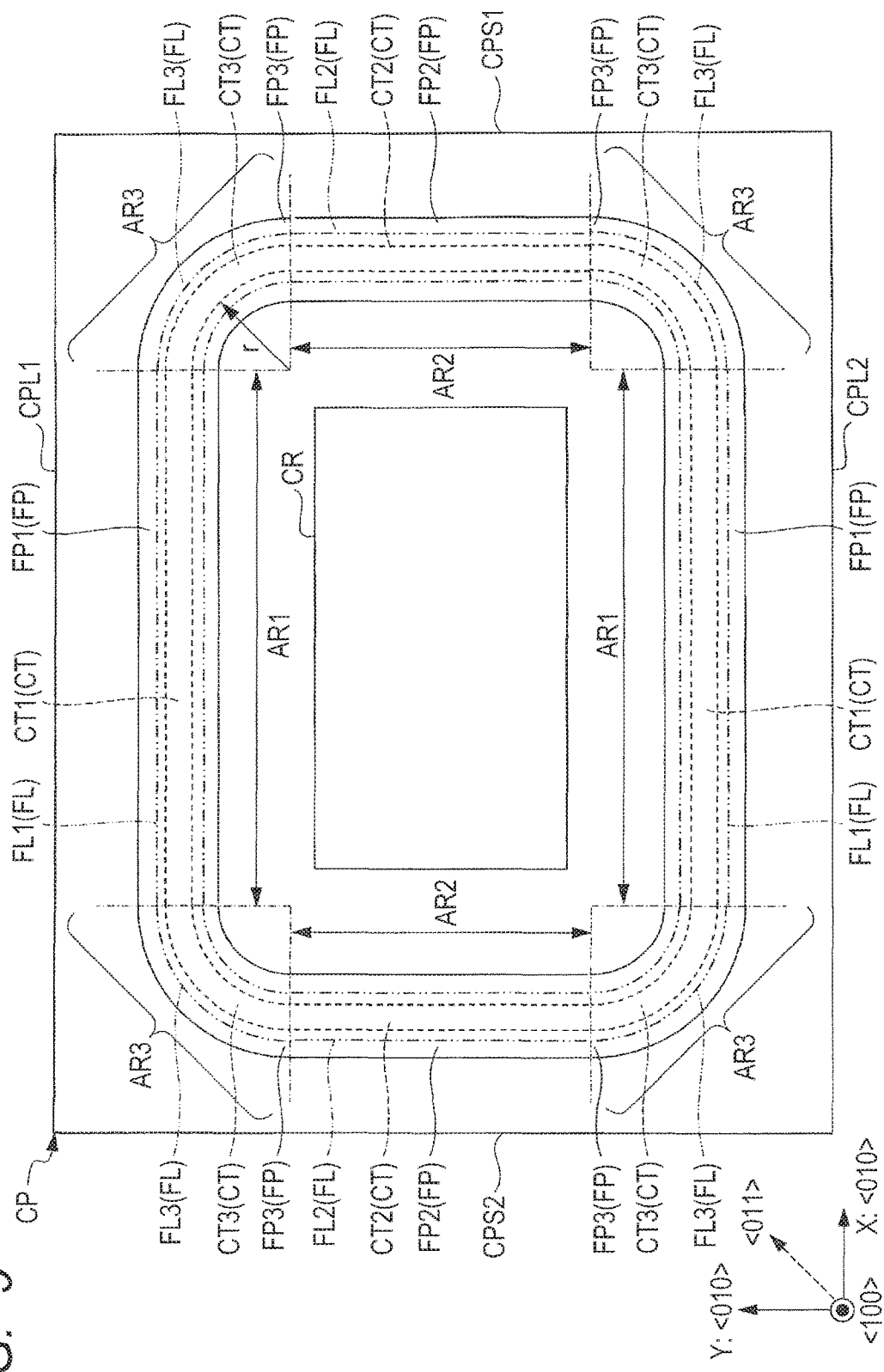
FIG. 9 is an essential part plan view of the semiconductor device of Study Example.
Figure 11:
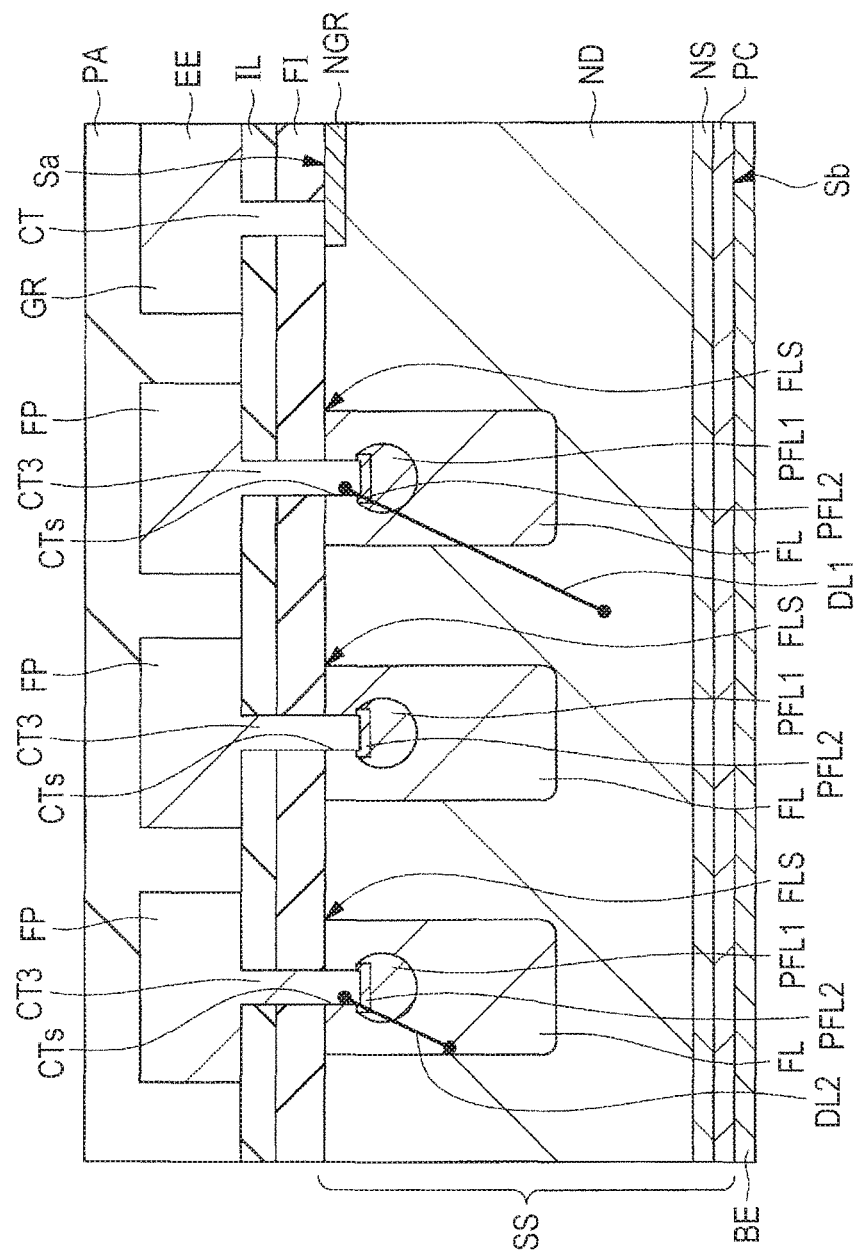
FIG. 11 is an essential part cross sectional view of the semiconductor device of Study Example.
Figure 12:
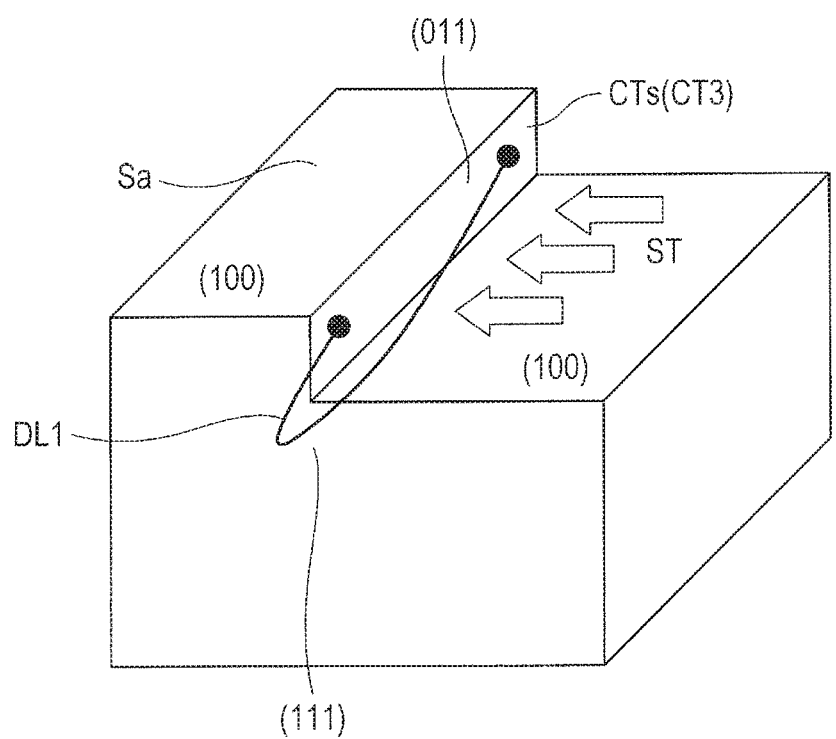
FIG. 12 is a model view of the semiconductor device of Study Example.

Then, by reference to FIGS. 9 to 12, a description will be given to the structure of Study Example, and the problem of Study Example confirmed by the present inventors. FIG. 9 is an essential part plan view of the semiconductor device of Study Example. FIG. 10 is an essential part plan view of the semiconductor device of Study Example. FIG. 11 is an essential part cross sectional view of the semiconductor device of Study Example. FIG. 12 is a model view of the semiconductor device of Study Example.

FIG. 9 shows the configurations of the field plate FP, the field limiting ring FL, and the contact trench CT, and the positional relationship therebetween by taking, for example, the field plate FP at the outermost periphery (on the guard ring GR side) shown in FIG. 1 as an example. As shown in FIG. 9, in the inside of the field plate FP, the cell formation region CR is arranged. Therefore, the field plate FP, the field limiting ring FL, and the contact trench CT each have a plan configuration continuously surrounding the periphery of the cell formation region CR. In other words, the field plate FP, the field limiting ring FL, and the contact trench CT each have an annular plan configuration circulating around the cell formation region CR.

As shown in FIG. 9, in a plan view, the width of the field plate FP is wider than the width of the field limiting ring FL and the contact trench CT. Then, the width of the field limiting ring FL is wider than the width of the contact trench CT. Therefore, the field plate FP covers the inner periphery and the outer periphery of the field limiting ring FL.

Further, the field plate FP, the field limiting ring FL, and the contact trench CT have a first region AR1 along the long sides CPL1 and CPL2 of the semiconductor device CP, a second region AR2 along the short sides CPS1 and CPS2 of the semiconductor device CP, and a third region AR3 connecting the first region and the second region. The third region AR3 is situated at the corner part of the semiconductor device CP. The field plate FP1, the field limiting ring FL1, and the contact trench CT1 situated in the first region AR1 extend in parallel with the long sides CPL1 and CPL2. In other words, they extend in the X direction of FIG. 9, and in the direction of the crystal orientation <010>. The field plate FP2, the field limiting ring FL2, and the contact trench CT2 situated in the second region AR2 extend in parallel with the short sides CPS1 and CPS2. In other words, they extend in the Y direction of FIG. 9, and in the direction of the crystal orientation <010>. Then, the field plate FP3 in the third region AR3 couples the field plate FP1 in the first region AR1 with the field plate FP2 in the second region AR2. Similarly, the field limiting ring FL3 in the third region AR3 couples the field limiting ring FL1 in the first region AR1 with the field limiting ring FL2 in the second region AR2. Similarly, the contact trench CH3 in the third region AR3 couples the contact trench CH1 in the first region AR1 with the contact trench CH2 in the second region AR2.

The field plate FP3, the field limiting ring FL3 and the contact trench CT3 situated in the third region AR3 each have a circular arc shape. Incidentally, the curvature radius r of the contact trench CT3 is about 500 to 700 μm. Then, as shown in FIG. 9, the third region AR3 crosses with the crystal orientation <011> of the direction tilted by 45° from the crystal orientation <010>.

FIG. 10 illustrates the states of the large dislocation loops DL1 and the small dislocation loops DL2 of the defects generated in the contact trench CT3 in the third region AR3. A study by the present inventors has confirmed that a large number of large dislocation loops DL1 and small dislocation loops DL2 are generated in the vicinity of the contact trench CT3 in the third region AR3. The large dislocation loop DL1 is a relatively larger dislocation loop with a depth of 7 μm or more, and the small dislocation loop DL2 is a relatively smaller dislocation loop with a depth of 3 μm or less. As shown in FIG. 10, it has been confirmed that in the third region AR3, the large dislocation loops DL1 are distributed in the region from the crystal orientation <011> to ±θ1 (θ1=15°) (which is referred to as a "large loop region DLR1"), and that the small dislocation loops DL2 are distributed in the regions (which are referred to as "small loop regions DLR2") at the opposite ends of the large dislocation loop region DLR1.

FIG. 11 is an essential part cross sectional view of the semiconductor device of Study Example, and illustrates the relationship between the large dislocation loop DL1 and the small dislocation loop DL2, and the field limiting ring FL. In other words, FIG. 11 illustrates the large dislocation loop DL1 generated in the large loop region DLR1, and the small dislocation loop DL2 generated in the small loop region DLR2 of FIG. 10. Whereas, FIG. 12 is a model view for illustrating the generation of the large dislocation loop DL1.

As shown in FIG. 11, the depth of the large dislocation loop DL1 is deeper than the depth (about 3 μm) of the field limiting ring FL, and crosses the field limiting ring FL, to reach the $n^-$ type drift region ND. In other words, a leakage current between the field limiting ring FL and the $n^-$ type drift region ND increases, which causes a breakdown voltage defect. On the other hand, the small dislocation loop DL2 has a low possibility of crossing the field limiting ring FL, which is not enough to increase the leakage current between the field limiting ring FL and the n⁻ type drift region ND.

As shown in FIG. 12, the large dislocation loop DL1 is generated at the sidewall CTs of the contact trench CT3 situated in the inside of the semiconductor substrate SS. Particularly, when the sidewall CTs is a crystal plane (011), and is in the vicinity thereof, the large dislocation loop DL1 is generated. The crystal plane (0111) is a structure having a lower surface density (being sparse) as compared with the crystal plane (010) or the crystal plane (001). For this reason, when a stress is generated, a dislocation loop tends to be generated along the crystal plane (111) of a slip plane. Therefore, as shown in FIG. 10, within the range of ±15° of the crystal orientation <011>, the large dislocation loop DL1 is generated. Further, according to the study by the present inventors, a stress is caused by expansion of the metal film (e.g., aluminum film) buried in the contact trench CT3 at the time of operation of the semiconductor device CP. In other words, at the time of operation of the semiconductor device CP, the temperature of the semiconductor device CP becomes high. Accordingly, a stress is generated at the sidewall CTs of the contact trench CT3 due to the difference in linear expansion coefficient between aluminum and silicon of the semi conductor substrate SS. Incidentally, the linear expansion coefficient ($23×10^{-6}$/K) of aluminum is one digit larger than the linear expansion coefficient ($2.4×10^{-6}$/K) of silicon. In other words, when the contact trench CT3 reaches the inside of the semiconductor substrate SS, and the sidewall CTs of the contact trench CT3 is the crystal plane (011), the large dislocation loop DL1 tends to be generated.

Incidentally, in the first region AR1 and the second region AR2 shown in FIG. 9, each sidewall CTs of the contact trenches CT1 and CT2 is the crystal plane {010}, and has a high surface density. For this reason, even when the sidewall CTs is applied with the stress, the large dislocation loop DL1 is not generated.

The study by the present inventors has confirmed that in the third region AR3 of the corner part of the semiconductor device CP, particularly, in the range of ±15° of the crystal orientation <011> (large loop region DLR1), the large dislocation loop DL1 is generated, and that a breakdown voltage defect is generated. Further, it has been confirmed that in the third region AR3, relatively smaller dislocation loops DL2 are generated in the small loop regions DLR2 on the opposite ends of the large loop region DLR1, which does not cause a breakdown voltage defect. Further, the study could also confirm that the large dislocation loop DL1 is not generated in the first region AR1 and the second region AR2.

The present inventors conducted a study on the countermeasure against the new problem. Then, a description will be given to the configuration for reducing or preventing the breakdown voltage defect of the semiconductor device CP.

Improvements in Embodiment

Figure 5:
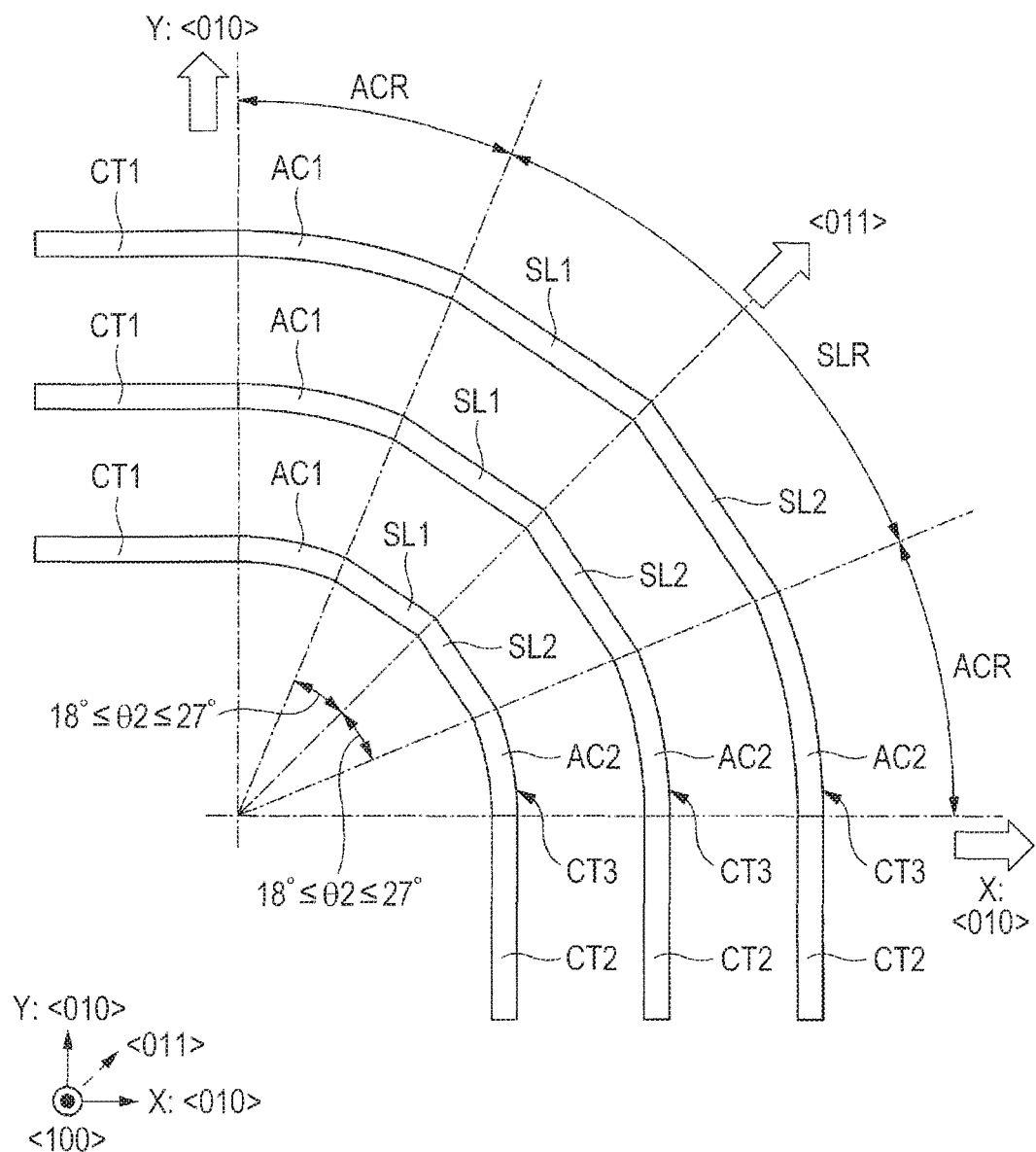
FIG. 5 is an essential part plan view of a semiconductor device of one embodiment.
Figure 6:
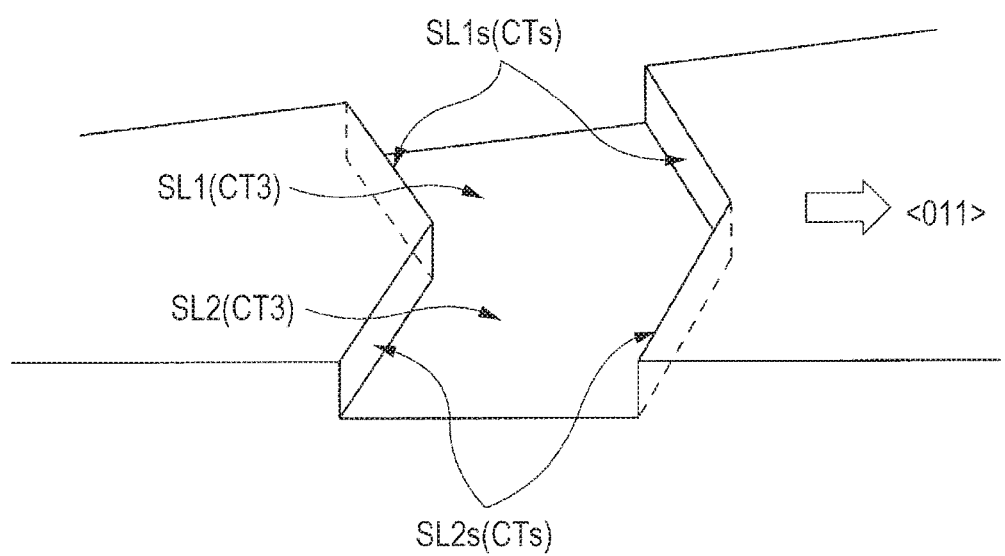
FIG. 6 is an essential part bird's eye view of a semiconductor device of one embodiment.

FIG. 5 is an essential part plan view of the semiconductor device of the present embodiment, and shows the configuration of the contact trench CT3 corresponding to the third region AR3. FIG. 5 shows triple contact trenches CT3. In the present embodiment shown in FIG. 5, a part of each contact trench CT3 situated on the opposite sides of the crystal orientation <011> is formed of two straight line parts SL1 and SL2 so as to prevent the sidewall of the contact trench CT3 from being the crystal plane {011}. The configuration except for this point is the same as the configuration of Study Example. In other words, FIGS. 1 and 9 are a part of the present embodiment. However, the configuration of the contact trench CT3 in the third region AR3 is as shown in FIG. 5. FIG. 6 is an essential part bird's eye view of the semiconductor device of the present embodiment.

The contact trench CT3 is situated between the contact trench CT1 and the contact trench CT2, and couples both. As illustrated in FIG. 9, the contact trench CT1 is situated in the first region along the long side CPL1 or CPL2 of the semi conductor device CP. Similarly, the contact trench CT2 is situated in the second region AR2 along the short side CPS1 or CPS2 of the semiconductor device CP.

As shown in FIG. 5, the contact trench CT3 is formed of the straight line region SLR and the circular arc regions ACR arranged on the opposite sides of the straight line region SLR.

In the straight line region SLR, two straight line parts SL1 and SL2 arranged line symmetrically with respect to the crystal orientation <011> are arranged. The straight line parts SL1 and SL2 extend linearly in directions different from the crystal orientation <010> and the crystal orientation <011>. Further, the straight line parts SL1 and SL2 extend in mutually different directions. Thus, the straight line region SLR is formed of the two straight line parts SL1 and SL2 extending in directions different from the crystal orientation <010> and the crystal orientation <011>. This can prevent the crystal plane {011} from coming out at the sidewall of the contact trench CT3 in the straight line region SLR. Therefore, it is possible to prevent the formation of the large dislocation loop DL1 in the straight line region SLR.

In the circular arc region ACR, circular arc parts AC1 and AC2 each in a circular arc shape are arranged. One end of the straight line part SL1 and one end of the straight line part SL2 are coupled with each other over the axis of the crystal orientation <011>. The other end of the straight line part SL1 is coupled with one end of the circular arc part AC1, and the other end of the circular arc part AC1 is coupled with the contact trench CT1. Further, the other end of the straight line part SL2 is coupled with one end of the circular arc part AC2, and the other end of the circular arc part AC2 is coupled with the contact trench CT2.

Whereas, the range of the straight line region SLR is assumed to fall within the range of ±θ2 (18°≤θ2≤27°) from the crystal orientation <011> as the center. Herein, when it is assumed that θ2<18°, the straight line region SLR approaches the circular arc of Study Example. For this reason, it is preferably assumed that θ2≥18°. Incidentally, when θ2=18°, the sidewall SL1s of the straight line part SL1 shown in FIG. 6 is the crystal plane {021}, and the sidewall SL2s of the straight line part SL2 is the crystal plane {012}. Then, when θ2=27°, the sidewall SL1s of the straight line part SL1 shown in FIG. 6 is the crystal plane {031}, and the sidewall SL2s of the straight line part SL2 is the crystal plane {013}.

Incidentally, the contact trenches CT3 in the circular arc region ACR are assumed to be circular arc parts AC1 and AC2 each in a circular arc shape in a plan view. However, each part can also be changed into a straight line part.

Figure 7:
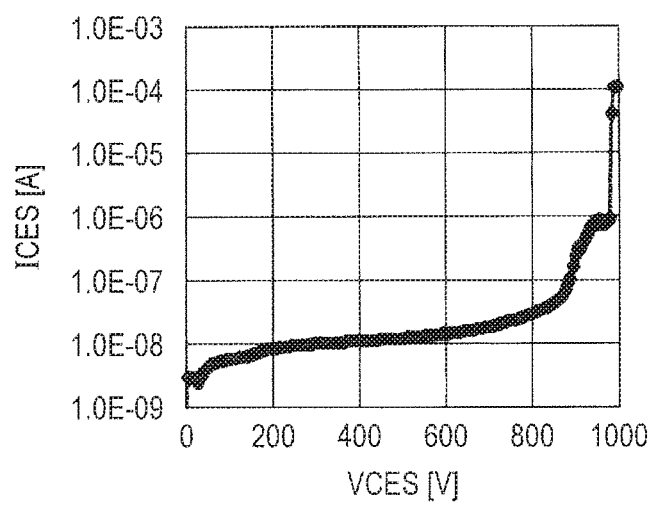
FIG. 7 shows the breakdown voltage characteristics of a semiconductor device of one embodiment.
Figure 8:
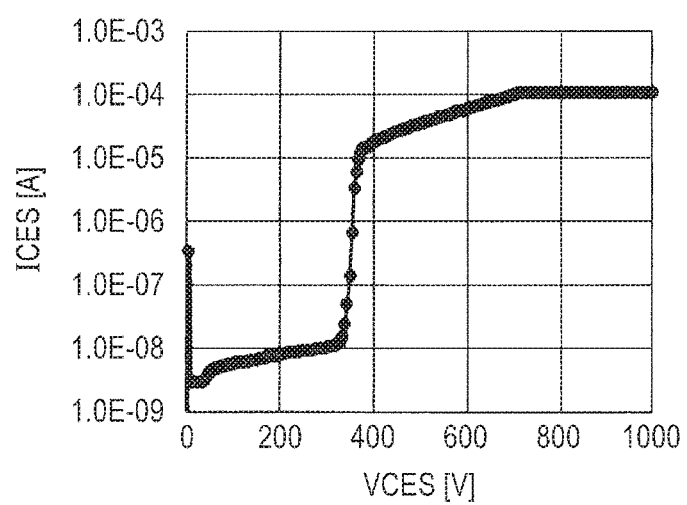
FIG. 8 shows the breakdown voltage characteristics of a semiconductor device of Study Example.

Then, FIG. 7 shows the breakdown voltage characteristics of the semiconductor device CP of the present embodiment. Further, FIG. 8 shows the breakdown voltage characteristics of the semiconductor device of Study Example. In Study Example, a breakdown voltage leakage is generated at about 350 V. However, in the present embodiment, the breakdown voltage leakage can be prevented at up to about 900 V.

Thus, the contact trench CT3 for coupling the field plate FP with the field limiting ring FL situated at the corner part of the semiconductor device CP is formed of the two straight line parts SL1 and SL2 arranged line symmetrically with respect to the crystal orientation <011>. Then, respective one ends of the two straight line parts SL1 and SL2 are coupled, and the straight line parts SL1 and SL2 are allowed to extend in different directions from the crystal orientation <010> and the crystal orientation <011>. As a result, the sidewall of the contact trench CT3 can be prevented from being the crystal plane {011}, which can prevent the generation of the large dislocation loop DL1.

In the straight line region SLR in FIG. 5, the contact trench CT3 is formed of the straight line parts SL1 and SL2 crossing at the crystal orientation <011>

Modified Example 1

Figure 13:
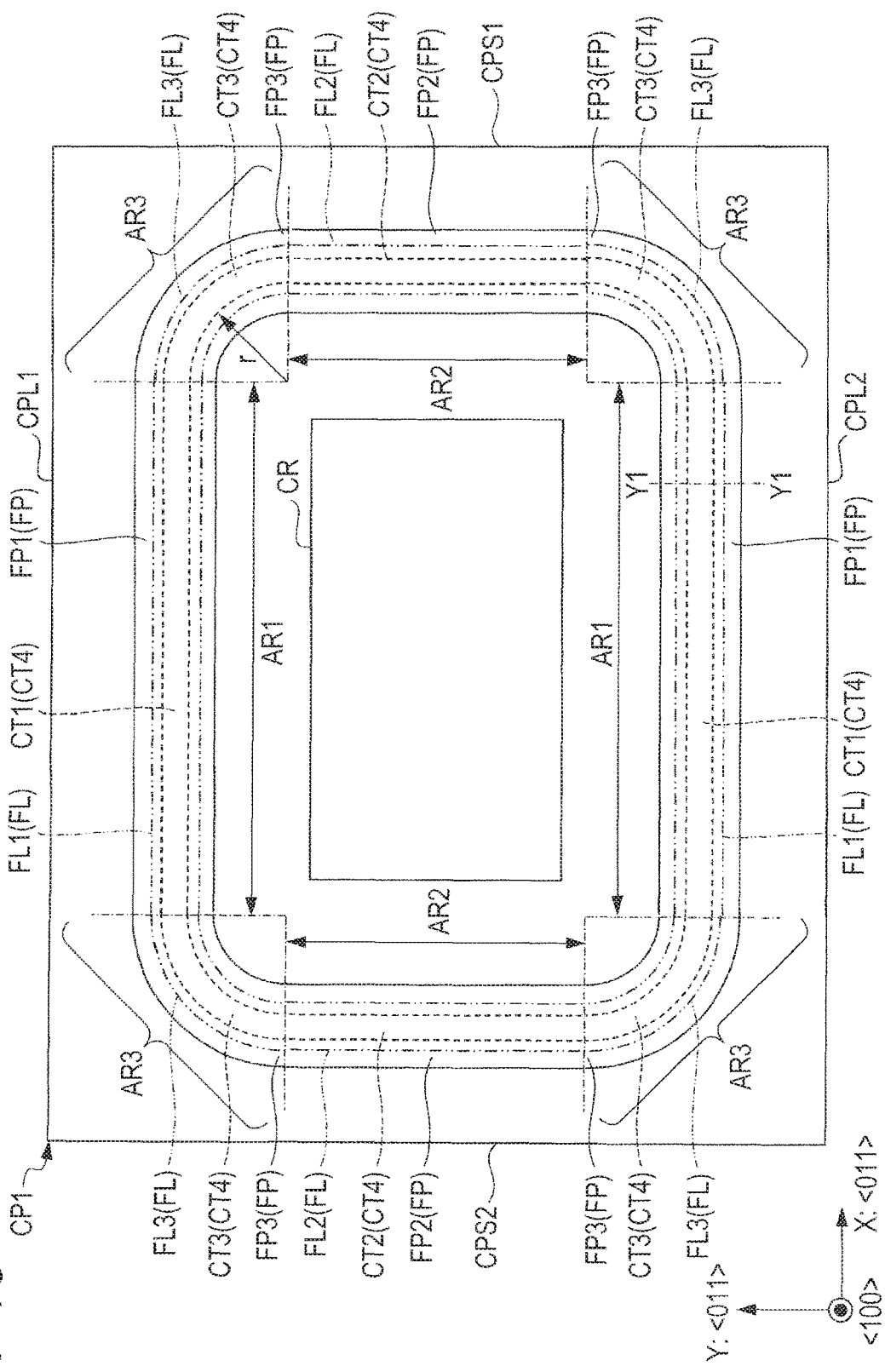
FIG. 13 is an essential part plan view of a semiconductor device of Modified Example 1.
Figure 14:
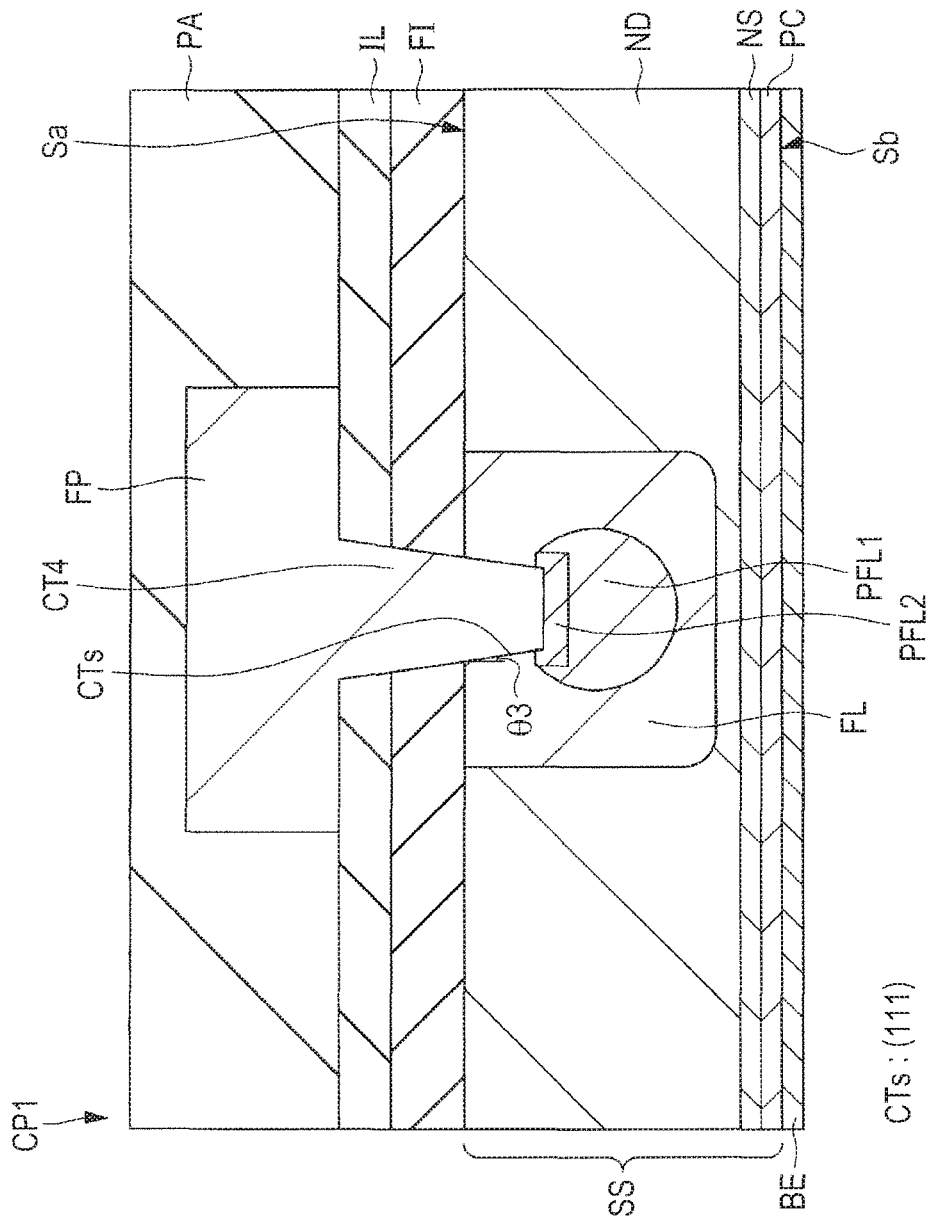
FIG. 14 is an essential part cross sectional view along line Y1-Y1 of FIG. 13.

FIG. 13 is an essential part plan view of a semiconductor device of Modified Example 1. FIG. 14 is an essential part cross sectional view along line Y1-Y1 of FIG. 13. A semiconductor device CP1 of Modified Example 1 is the same as the semiconductor device CP of the embodiment. The semiconductor device CP1 is formed at a single crystal silicon substrate. The surface Sa corresponds to the crystal plane {100} of the single crystal silicon substrate. However, as shown in FIG. 13, the long sides CPL1 and CPL2 extending in the X direction correspond to the crystal orientation <011>. The short sides CPS1 and CPS2 extending in the Y direction orthogonal to the X direction also correspond to the crystal orientation <011>. Then, as with the embodiment, the contact trench CT4 for coupling the field plate FP with the field limiting ring FL is formed in an annular shape in such a manner as to surround the cell formation region CR.

As shown in FIG. 14, the sidewall CTs of the contact trench CT4 has a tilt $\theta 3$ ($\theta 3=35°$) with respect to the direction perpendicular to the surface Sa of the semiconductor substrate SS. Incidentally, when the tilt $\theta 3=35°$, the sidewall CTs of the contact trench CT4 becomes the crystal plane {111}.

Then, as shown in FIG. 13, the sidewall of the annular contact trench CT4 circulating around the cell formation region CR has a tilt $\theta 3$ ($\theta 3=35°$) with respect to the direction perpendicular to the surface Sa of the semiconductor substrate SS throughout the periphery thereof. However, it is essential that, in the first region AR1 and the second region AR2 shown in FIG. 13, the sidewalls of the contact trenches CT1 and CT2 are allowed to have a tilt $\theta 3$. In the third region AR3, the sidewall of the contact trench CT3 may be made in agreement with the direction perpendicular to the surface Sa of the semiconductor substrate SS.

In Modified Example 1, in the first region AR1 and the second region AR2 shown in FIG. 13, the plane perpendicular to the surface Sa of the semiconductor substrate SS becomes the crystal plane {011}. For this reason, when a tilt is not given to the sidewall of the contact trench CT3, there is a high possibility that the large dislocation loop DL1 is generated in the first region AR1 and the second region AR2. Therefore, in order to prevent the large dislocation loop DL1, it is essential that a tilt $\theta 3$ is given to the sidewalls of the contact trenches CT1 and CT2 in the first region AR1 and the second region AR2.

In Modified Example 1, the sidewall of the contact trench CT4 is set to be the crystal plane {111} having a higher surface density than that of the crystal plane {011}. This can prevent the generation of the large dislocation loop DL1 at the sidewall of the contact trench CT4.

Modified Example 2

Figure 15:
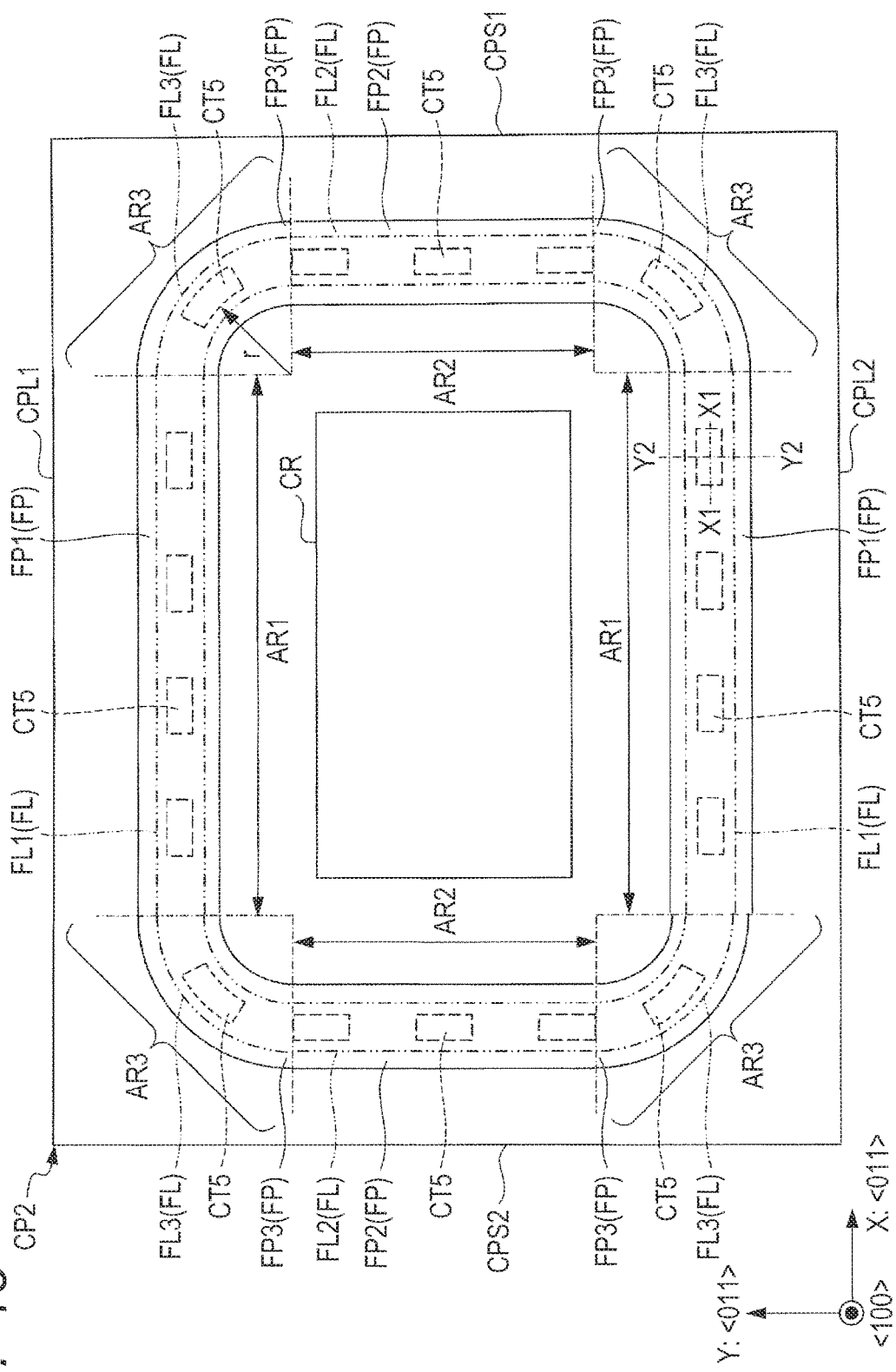
FIG. 15 is an essential part plan view of a semiconductor device of Modified Example 2.

FIG. 15 is an essential part plan view of a semiconductor device CP2 or Modified Example 2. Modified Example 2 is a modified example of Modified Example 1. The contact trench CT4 continuously formed to circulate around the cell formation region CR is formed of a plurality of contact trenches CT5. For example, the cross sectional structure of the contact trench CT5 along line Y2-Y2 of FIG. 15 is the same as that of FIG. 14 of Modified Example 1. In other words, the sidewall CTs of the contact trench CT5 has a tilt $\theta 3$ ($\theta 3=35°$) with respect to the direction perpendicular to the surface Sa of the semiconductor substrate SS. Further, in Modified Example 2, also at the cross section along X1-X1 of FIG. 15, the sidewall CTs of the contact trench CT5 has a tilt $\theta 3$ ($\theta 3=35°$) with respect to the direction perpendicular to the surface Sa of the semiconductor substrate SS.

In Modified Example 2, at the cross section in the X direction and the Y direction of the contact trench CT5, the same effects as those of Modified Example 1 can be produced.

Up to this point, the invention completed by the present inventors was described specifically by way of embodiments. However, it is naturally understood that the present invention is not limited to the embodiments, and may be variously changed within the scope not departing from the gist thereof.

What is claimed is:
1. A semiconductor device, comprising:
a semiconductor substrate having a first main surface having a first side, and a second side orthogonal to the first side, and a second main surface opposite to the first main surface;
a cell formation region formed at the first main surface, and having a plurality of transistors;
a first semiconductor region of a first conductivity type continuously surrounding the periphery of the cell formation region, and formed at the first main surface of the semiconductor substrate;
an insulation film formed over the first main surface of the semiconductor substrate;
a contact trench continuously surrounding the periphery of the cell formation region, and formed in the insulation film and the semiconductor substrate; and
a wire continuously surrounding the periphery of the cell formation region, and formed in the inside of the contact trench and over the insulation film, and coupled with the first semiconductor region,
wherein the first main surface of the semiconductor substrate is the {100} plane of single crystal silicon,
wherein the first side and the second side of the semiconductor substrate extend in the <010> direction,
wherein the contact trench includes a first contact trench extending linearly along the first side, a second contact trench extending linearly along the second side, and a third contact trench coupling the first contact trench with the second contact trench,
wherein the third contact trench has a first straight line part and a second straight line part symmetrically arranged with respect to the <011> direction tilted by 45° with respect to the <010> direction as the symmetry axis, wherein one end of the first straight line part and one end of the second straight line part are coupled with each other, and
wherein the first straight line part and the second straight line part extend in mutually different directions, and extend in different directions from the <010> direction and the <011> direction.

2. The semiconductor device according to claim 1, wherein the wire includes an aluminum film.

3. The semiconductor device according to claim 2, wherein the wire includes a lamination structure of the aluminum film and a tungsten nitride film.

4. The semiconductor device according to claim 1, wherein the first straight line part and the second straight line part fall within the range of ±18° or more and ±27° or less from the <011> direction.

5. The semiconductor device according to claim 1, further comprising:
a first coupling part for coupling the other end of the first straight line part with the first contact trench; and
a second coupling part for coupling the other end of the second straight line part with the second contact trench,
wherein the first coupling part and the second coupling part each have a circular arc shape.

6. The semiconductor device according to claim 1, wherein the first straight line part extends in the <021> direction, and
wherein the second straight line part extends in the <012> direction.

7. The semiconductor device according to claim 6, wherein a first sidewall of the first straight line part of the third contact trench is the (021) plane, and
wherein a second sidewall of the second straight line part of the third contact trench is the (012) plane.

8. The semiconductor device according to claim 1, wherein the first straight line part extends in the <031> direction, and
wherein the second straight line part extends in the <013> direction.

9. The semiconductor device according to claim 8, wherein a first sidewall of the first straight line part of the third contact trench is the (031) plane, and
wherein a second sidewall of the second straight line part of the third contact trench is the (013) plane.

10. The semiconductor device according to claim 1, wherein each of the plurality of the transistors has:
a second semiconductor region formed on the second main surface side, and being of the first conductivity type;
a third semiconductor region formed over the second semiconductor region, and being of a second conductivity type of an opposite conductivity type to the first conductivity type;
a first trench and a second trench formed from the first main surface toward the second main surface of the semiconductor substrate;
a first gate electrode formed in the first trench, and a second gate electrode formed in the second trench;
a fourth semiconductor region of the first conductivity type formed over the third semiconductor region between the first trench and the second trench; and
a fifth semiconductor region of the second conductivity type formed over the fourth semiconductor region between the first trench and the second trench.

11. A semiconductor device, comprising:
a semiconductor substrate having a first main surface having a first side, and a second side orthogonal to the first side, and a second main surface opposite to the first main surface;
a cell formation region formed at the first main surface, and having a plurality of transistors;
a first semiconductor region of a first conductivity type continuously surrounding the periphery of the cell formation region, and formed at the first main surface of the semiconductor substrate;
an insulation film formed over the first main surface of the semiconductor substrate;
a contact trench continuously surrounding the periphery of the cell formation region, and formed in the insulation film and the semiconductor substrate; and
a wire continuously surrounding the periphery of the cell formation region, and formed in the inside of the contact trench and over the insulation film, and coupled with the first semiconductor region,
wherein the first main surface of the semiconductor substrate is the {100} plane of single crystal silicon,
wherein the first side and the second side of the semiconductor substrate extend in the <011> direction,
wherein the contact trench includes a first contact trench extending linearly along the first side, and
wherein the sidewall of the first contact trench is tilted by 35° with respect to the plane perpendicular to the first main surface.

12. The semiconductor device according to claim 11, wherein the sidewall of the first contact trench is the (111) plane.

13. A semiconductor device, comprising:
a semiconductor substrate having a first main surface having a first side, and a second side orthogonal to the first side, and a second main surface opposite to the first main surface;
a cell formation region formed at the first main surface, and having a plurality of transistors;
a first semiconductor region of a first conductivity type continuously surrounding the periphery of the cell formation region, and formed at the first main surface of the semiconductor substrate;
an insulation film formed over the first main surface of the semiconductor substrate;
a plurality of contact trenches arranged so as to surround the periphery of the cell formation region, and formed in the insulation film and the semiconductor substrate; and
a wire continuously surrounding the periphery of the cell formation region, and formed in each inside of the contact trenches and over the insulation film, and coupled with the first semiconductor region,
wherein the first main surface of the semiconductor substrate is the {100} plane of single crystal silicon,
wherein the first side and the second side of the semiconductor substrate extend in the <011> direction, and
wherein the sidewalls of the contact trenches are tilted by 35° with respect to the plane perpendicular to the first main surface.

* * * * *